(12) United States Patent
Chari et al.

(10) Patent No.: US 10,886,424 B2
(45) Date of Patent: Jan. 5, 2021

(54) METHOD FOR BLACKENING A METALLIC ARTICLE

(71) Applicant: Merlin Solar Technologies, Inc., San Jose, CA (US)

(72) Inventors: Arvind Chari, Saratoga, CA (US); Venkatesan Murali, Los Gatos, CA (US); Robert Brainard, Sunnyvale, CA (US); Gopal Prabhu, San Jose, CA (US); Jesse Dam, Union City, CA (US)

(73) Assignee: Merlin Solar Technologies, Inc., San Jose, CA (US)

( * ) Notice: Subject to any disclaimer, the term of this patent is extended or adjusted under 35 U.S.C. 154(b) by 0 days.

(21) Appl. No.: 16/454,581

(22) Filed: Jun. 27, 2019

(65) Prior Publication Data

US 2020/0013913 A1    Jan. 9, 2020

Related U.S. Application Data

(60) Provisional application No. 62/743,178, filed on Oct. 9, 2018, provisional application No. 62/694,644, filed on Jul. 6, 2018.

(51) Int. Cl.
*H01L 31/05* (2014.01)
*C25D 1/00* (2006.01)
*H01L 31/0224* (2006.01)

(52) U.S. Cl.
CPC ............ *H01L 31/0508* (2013.01); *C25D 1/00* (2013.01); *H01L 31/022433* (2013.01)

(58) Field of Classification Search
CPC .............................. C25D 1/00; H01L 31/02008
See application file for complete search history.

(56) References Cited

U.S. PATENT DOCUMENTS 3,657,023 A   4/1972  Grunwald et al.
5,393,353 A   2/1995  Bishop
(Continued)

FOREIGN PATENT DOCUMENTS

JP   2017025382 A   2/2017
KR   20140033424 A   3/2014

OTHER PUBLICATIONS

International Search Report dated Oct. 21, 2019 for PCT Patent Application No. PCT/US19/39436.

*Primary Examiner* — Jay C Chang
*Assistant Examiner* — Mikka Liu
(74) *Attorney, Agent, or Firm* — MLO, a professional corp.

(57) ABSTRACT

A method includes providing an electrically conductive mandrel having an outer surface layer comprising a preformed pattern. The metallic article is electroformed. The metallic article includes a plurality of electroformed elements formed in the preformed pattern on the outer surface layer of the mandrel. The plurality of electroformed elements have a first side adjacent to the outer surface layer of the mandrel and a second side. A solder is plated on the second side of the plurality of electroformed elements while on the mandrel. The metallic article is separated from the mandrel. The plurality of electroformed elements are interconnected such that the metallic article forms a unitary, free-standing piece. A solution is applied to create a blackening of the first side of the plurality of electroformed elements. The solder on the second side of the plurality of electroformed elements is not blackened.

17 Claims, 20 Drawing Sheets

(56) References Cited

U.S. PATENT DOCUMENTS

| | | |
|---|---|---|
| 8,916,038 B2 | 12/2014 | Babayan et al. |
| 8,936,709 B2 | 1/2015 | Babayan et al. |
| 9,952,481 B2 | 4/2018 | Rozbicki et al. |
| 2001/0029975 A1 | 10/2001 | Takeyama et al. |
| 2003/0178058 A1 | 9/2003 | Jongerden et al. |
| 2010/0021695 A1* | 1/2010 | Naoyuki ................ B41C 1/00 428/173 |
| 2014/0060612 A1 | 3/2014 | DiCenso et al. |
| 2014/0262793 A1* | 9/2014 | Babayan ........... H01L 31/02243 205/78 |
| 2014/0318613 A1 | 10/2014 | Campe et al. |
| 2015/0129024 A1 | 5/2015 | Brainard et al. |
| 2015/0349167 A1 | 12/2015 | Morad et al. |
| 2015/0349175 A1 | 12/2015 | Morad et al. |
| 2016/0039032 A1 | 2/2016 | Vornbrock et al. |
| 2017/0040480 A1 | 2/2017 | Cho et al. |
| 2017/0373211 A1 | 12/2017 | Murali et al. |
| 2018/0122973 A1 | 5/2018 | Pilliod et al. |

* cited by examiner

Solution A — No Current

| COMPOSITION | PERCENTAGE |
|---|---|
| FLUOBORIC ACID | 10-30 |
| CUPRIC SULFATE | 5-10 |
| SELENIOUS ACID | 1-5 |
| PHOSPHORIC ACID | 1-5 |
| NICKEL SULFATE | 0.1-1 |
| WATER | 60-90 |

Solution B — No Current

| COMPOSITION |
|---|
| NICKEL IONS |
| REDUCING AGENTS |
| PLEXING AGENTS |
| NEUTRALIZERS |
| STABILIZER |
| BRIGHTENER |

Solution C — No Current

| COMPOSITION |
|---|
| WATER |
| POTASSIUM SULFIDE (K2S) FAMILY |

$K_2S$ FAMILY = SULFIDE, POLYSULFIDE, THIOSULFATE & BISULFIDE OF DIFFERENT AMOUNTS
 - A NATURAL LOS ALTERNATIVE IS EGG YOLK BUT THE WORKS MUCH SLOWER
$Cu_xS_y$ - PRIMARILY $Cu_2S$ AND CuS BUT WITH OTHER POSSIBLE NON-STOICHIOMETRIC BINARIES
 - CuS AND $Cu_2S$ RANGE THE GRAY TO BLACK AND THEIR COMBINATIONS COVER THE RANGE OF SHADES

Solution D — With Current

| COMPOSITION | GRAMS/LITER |
|---|---|
| AMMONIUM SULPHATE | 20 |
| NICKEL SULPHATE | 120 |
| ZINC SULPHATE | 45 |
| SODIUM SULPHOCYANIDE | 18 |

*FIG. 13*

METHOD FOR BLACKENING A METALLIC ARTICLE

RELATED APPLICATIONS

This application claims priority to U.S. Provisional Patent Application No. 62/694,644 filed on Jul. 6, 2018 and entitled "Method for Blackening a Metallic Article," and U.S. Provisional Patent Application No. 62/743,178 filed on Oct. 9, 2018 and entitled "Method for Blackening a Metallic Article," which are both hereby incorporated by reference in full.

BACKGROUND

A solar cell is a device that converts photons into electrical energy. The electrical energy produced by the cell is collected through electrical contacts coupled to the semiconductor material, and is routed through interconnections with other photovoltaic cells in a module. The use of solar energy has become increasingly popular because of the many benefits the technology offers. The modules may be for personal, residential, military or commercial use.

The electrical contacts and interconnections of the light-facing side of the modules are typically a metal material which may be shiny, light-reflective, and have a high contrast in color compared to the solar cell to which it is attached, thus visible to the human eye. Because of this, the module may not be aesthetically pleasing and detract from the particular application. For example, roof systems for the residential market such as solar shingles are available and customers desire an attractive, sleek look of the roof without the detraction of exposed wires and/or connections. In commercial use, such as the trucking industry, solar energy may be used on the roof of the truck. Customers desire a professional, uniform look of solar modules on the truck. In some applications, the presence of solar modules need to be undetectable such as in military operations. For example, solar energy may be collected and used for power generators, battery packs or wearable technology but the modules need to be stealth and not visible to the enemy to give away the position of the user. In another use case, solar modules may be placed on the top of vehicles, either electric or gas, to increase their efficiency, and must be aesthetically pleasing to the end user who is purchasing the product.

Some solar modules may have their appearance altered to make the look more pleasing by using a dot pattern on a cover glass or plastic sheet on the module. The dot pattern may form images that are visible at a distance, but when close, the individual dots are visible as well as the contents behind the cover glass or plastic sheet such as the electrical contacts and interconnections on the light-facing side of the module. Additionally, the dot pattern may reduce the efficiency of the solar module since some of the light is blocked by the dot pattern.

SUMMARY

Disclosed is a method of manufacturing a metallic article for a photovoltaic cell, the method includes providing an electrically conductive mandrel having an outer surface layer comprising a preformed pattern. The metallic article is electroformed. The metallic article includes a plurality of electroformed elements formed in the preformed pattern on the outer surface layer of the mandrel. The plurality of electroformed elements have a first side adjacent to the outer surface layer of the mandrel and a second side opposite the first side. A solder is plated on the second side of the plurality of electroformed elements while on the mandrel. The metallic article is separated from the mandrel. The plurality of electroformed elements are interconnected such that the metallic article forms a unitary, free-standing piece when separated from the mandrel. A solution is applied to the metallic article after separating the metallic article from the mandrel to create a blackening of the first side of the plurality of electroformed elements. The solder on the second side of the plurality of electroformed elements is not blackened.

BRIEF DESCRIPTION OF THE DRAWINGS

Each of the aspects and embodiments of the invention described herein can be used alone or in combination with one another. The aspects and embodiments will now be described with reference to the attached drawings.

FIG. 13 shows example solution in the blackening process, in accordance with some embodiments.

DETAILED DESCRIPTION OF THE EMBODIMENTS

Figure 1:
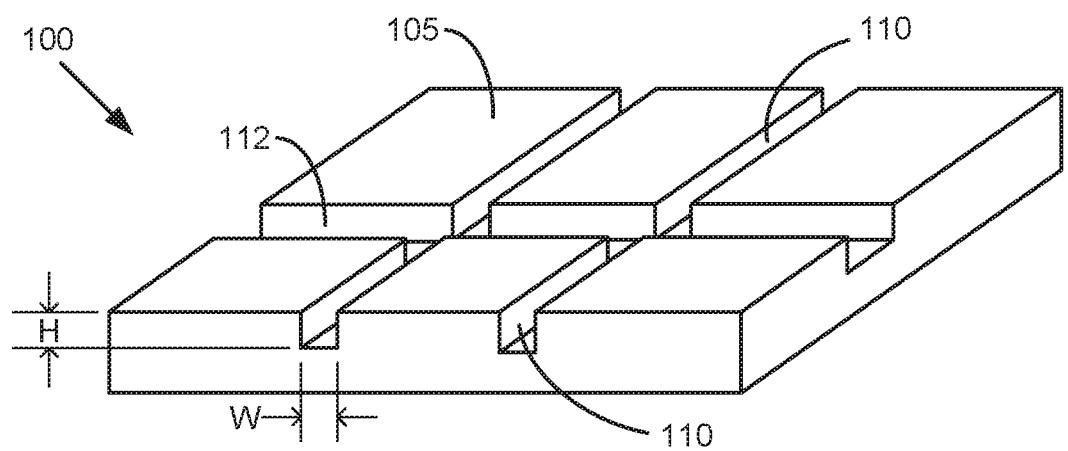
FIG. 1 shows a perspective view of an example electroforming mandrel in one embodiment.

Metallization of solar cells is conventionally achieved with screen printed silver pastes on the surface of the cell, and cell-to-cell interconnections that utilize solder-coated ribbons. The metallic article of the present disclosure is manufactured in an electroforming mandrel, which generates a patterned metal layer that is tailored for a solar cell or other semiconductor device. For example, the metallic article may have grid lines with height-to-width aspect ratios that minimize shading for a solar cell and the metallic article may be coated with a blackening material. The metallic article can replace conventional bus bar metallization and ribbon stringing for cell metallization, cell-to-cell interconnection and module making. The metallic article has a "blackened" surface that dramatically improves the aesthetic appearance of the solar module, without adversely affecting the efficiency of the product. The term "blackened" in this disclosure shall be used to describe changing the metallic article from its natural metal color to a different color, which will generally imply a dark or black color similar to the solar cell on which the metallic article is mounted. However, the present embodiments can be used to create other colors on the metallic articles as well.

In Babayan et al., U.S. patent application Ser. No. 13/798,123, issued as U.S. Pat. No. 8,916,038, entitled "Free-Standing Metallic Article for Semiconductors" filed on Mar. 13, 2013, electrical conduits for semiconductors such as photovoltaic cells are fabricated as an electroformed free-standing metallic article. Additional electrical conduits are also disclosed in Babayan et al., U.S. Pat. No. 8,936,709, entitled "Adaptable Free-Standing Metallic Article for Semiconductors" filed on Nov. 13, 2013; and in Brainard et al., U.S. patent application Ser. No. 14/079,544, entitled "Free-Standing Metallic Article With Expansion Segment" filed on Nov. 13, 2013, all of which are owned by the assignee of the present application and are hereby incorporated by reference. The metallic articles are produced separately from a solar cell and can include multiple elements such as fingers and bus bars that can be transferred stably as a unitary piece and easily aligned to a semiconductor device. The elements of the metallic article are formed integrally with each other in the electroforming process. The metallic article is manufactured in an electroforming mandrel, which generates a patterned metal layer that is tailored for a solar cell or other semiconductor device. For example, the metallic article may have grid lines with height-to-width aspect ratios that minimize shading for a solar cell. The metallic article can replace conventional bus bar metallization and ribbon stringing for cell metallization, cell-to-cell interconnection and module making. The ability to produce the metallization layer for a photovoltaic cell as an independent component that can be stably transferred between processing steps provides various advantages in material costs and manufacturing.

FIG. 1 depicts a perspective view of a portion of an example electroforming mandrel 100 in one embodiment of U.S. patent application Ser. No. 13/798,123. The mandrel 100 may be made of electrically conductive material such as stainless steel, copper, anodized aluminum, titanium, or molybdenum, nickel, nickel-iron alloy (e.g., Invar), copper, or any combinations of these metals, and may be designed with sufficient area to allow for high plating currents and enable high throughput. The mandrel 100 has an outer surface 105 with a preformed pattern that comprises pattern elements 110 and 112 and can be customized for a desired shape of the electrical conduit element to be produced. In this embodiment, the pattern elements 110 and 112 are grooves or trenches with a rectangular cross-section, although in other embodiments, the pattern elements 110 and 112 may have other cross-sectional shapes. The pattern elements 110 and 112 are depicted as intersecting segments to form a grid-type pattern, in which sets of parallel lines intersect perpendicularly to each other in this embodiment.

The pattern elements 110 have a height 'H' and width 'W', where the height-to-width ratio defines an aspect ratio. By using the pattern elements 110 and 112 in the mandrel 100 to form a metallic article, the electroformed metallic parts can be tailored for photovoltaic applications. For example, the aspect ratio may be between about 0.01 and about 10 as desired, to meet shading constraints of a solar cell.

The aspect ratio, as well as the cross-sectional shape and longitudinal layout of the pattern elements, may be designed to meet desired specifications such as electrical current capacity, series resistance, shading losses, and cell layout. Any electroforming process can be used. For example, the metallic article may be formed by an electroplating process. In particular, because electroplating is generally an isotropic process, confining the electroplating with a pattern mandrel to customize the shape of the parts is a significant improvement for maximizing efficiency. Furthermore, although certain cross-sectional shapes may be unstable when placing them on a semiconductor surface, the customized patterns including curved elements that may be produced through the use of a mandrel allow for features such as interconnecting lines to provide stability for these conduits. In some embodiments, for example, the preformed patterns may be configured as a continuous grid with intersecting lines. This configuration not only provides mechanical stability to the plurality of electroformed elements that form the grid, but also enables a low series resistance since the current is spread over more conduits. A grid-type structure can also increase the robustness of a cell. For example, if some portion of the grid becomes broken or non-functional, the electrical current can flow around the broken area due to the presence of the grid pattern.

Figure 2A:
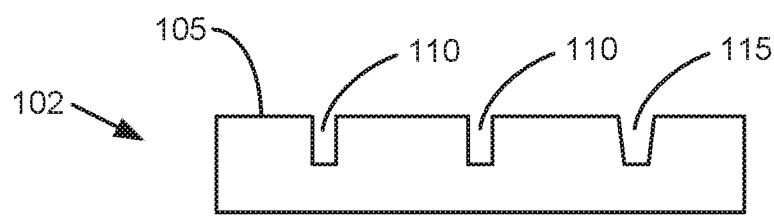
FIGS. 2A-2C depict cross-sectional views of example stages in producing a free-standing electroformed metallic article.
Figure 2B:
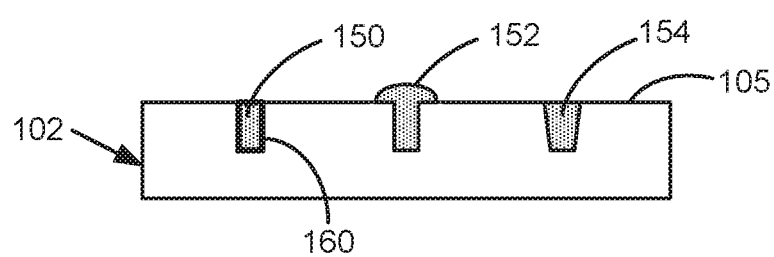
Figure 2C:
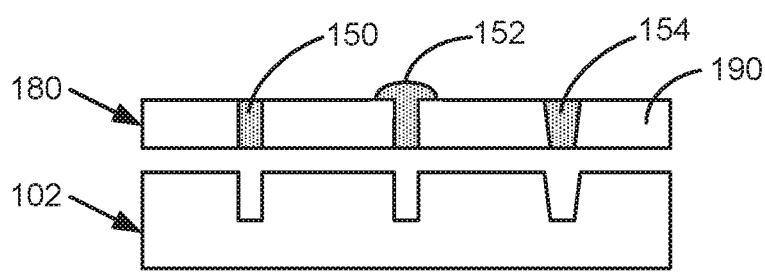

FIGS. 2A-2C are simplified cross-sectional views of example stages in producing a metal layer piece using a mandrel, as disclosed in U.S. patent application Ser. No. 13/798,123. In FIG. 2A, a mandrel 102 with pattern elements 110 and 115 is provided. Pattern element 115 has a vertical cross-section that is tapered, being wider toward the outer surface 105 of the mandrel 102. The tapered vertical cross-section may provide certain functional benefits, such as increasing the amount of metal to improve electrical conductivity, or aiding in removal of the electroformed piece from the mandrel 102. The mandrel 102 is subjected to an electroforming process, in which example electroformed elements 150, 152 and 154 are formed within the pattern elements 110 and 115 as shown in FIG. 2B. The electroformed elements 150, 152 and 154 may be, for example, copper only, or alloys of copper. In other embodiments, a layer of nickel may be plated onto the mandrel 102 first, followed by copper so that the nickel provides a barrier against copper contamination of a finished semiconductor device. An additional nickel layer may optionally be plated over the top of the electroformed elements to encapsulate the copper, as depicted by nickel layer 160 on electroformed element 150 in FIG. 2B. In other embodiments, multiple layers may be plated within the pattern elements 110 and 115, using various metals as desired to achieve the necessary properties of the metallic article to be produced.

In FIG. 2B the electroformed elements 150 and 154 are shown as being formed flush with the outer surface 105 of mandrel 102. Electroformed element 152 illustrates another embodiment in which the elements may be overplated. For electroformed element 152, electroplating continues until the metal extends above the surface 105 of mandrel 102. The overplated portion, which typically will form as a rounded top due to the isotropic nature of electroforming, may serve as a handle to facilitate the extraction of the electroformed element 152 from mandrel 102. The rounded top of electroformed element 152 may also provide optical advantages in a photovoltaic cell by, for example, being a reflective surface to aid in light collection. In yet other embodiments not shown, a metallic article may have portions that are formed on top of the mandrel surface 105, such as a bus bar, in addition to those that are formed within the preformed patterns 110 and 115.

In FIG. 2C the electroformed elements 150, 152 and 154 are removed from the mandrel 102 as a free-standing metallic article 180. Note that FIGS. 2A-2C demonstrate three different types of electroformed elements 150, 152 and 154. In various embodiments, the electroformed elements within the mandrel 102 may be all of the same type, or may have different combinations of electroformed patterns. The metallic article 180 may include intersecting elements 190, such as would be formed by the cross-member patterns 112 of FIG. 1. The intersecting elements 190 may assist in making the metallic article 180 a unitary, free-standing piece such that it may be easily transferred to other processing steps while keeping the individual elements 150, 152 and 154 aligned with each other. The additional processing steps may include steps such as a blackening method for the free-standing metallic article 180 and assembly steps to incorporate it into a semiconductor device. By producing the metal layer of a semiconductor as a free-standing piece, the manufacturing yields of the overall semiconductor assembly will not be affected by the yields of the metal layer. In addition, the metal layer can be subjected to temperatures and processes separate from the other semiconductor layers. For example, the metal layer may be undergo high temperature processes or chemical baths that will not affect the rest of the semiconductor assembly.

After the metallic article 180 is removed from mandrel 102 in FIG. 2C, the mandrel 102 may be reused to produce additional parts. Being able to reuse the mandrel 102 provides a significant cost reduction compared to current techniques where electroplating is performed directly on a solar cell. In direct electroplating methods, mandrels are formed on the cell itself, and thus must be built and often destroyed on every cell. Having a reusable mandrel reduces processing steps and saves cost compared to techniques that require patterning and then plating a semiconductor device. In other conventional methods, a thin printed seed layer is applied to a semiconductor surface to begin the plating process. However, seed layer methods result in low throughputs. In contrast, reusable mandrel methods as described herein can utilize mandrels of thick metal which allow for high current capability, resulting in high plating currents and thus high throughputs. Metal mandrel thicknesses may be, for example, between 0.2 to 5 mm.

Figure 3A:
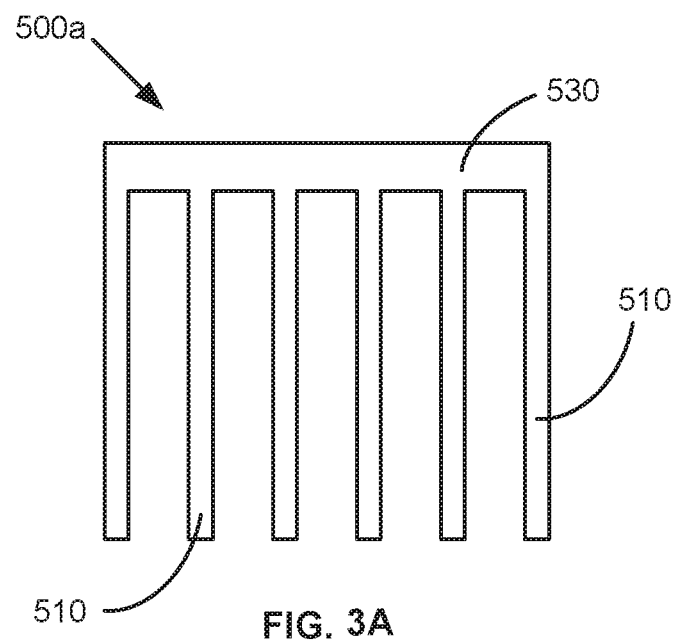
FIGS. 3A-3B are top views of two embodiments of metallic articles.
Figure 3B:
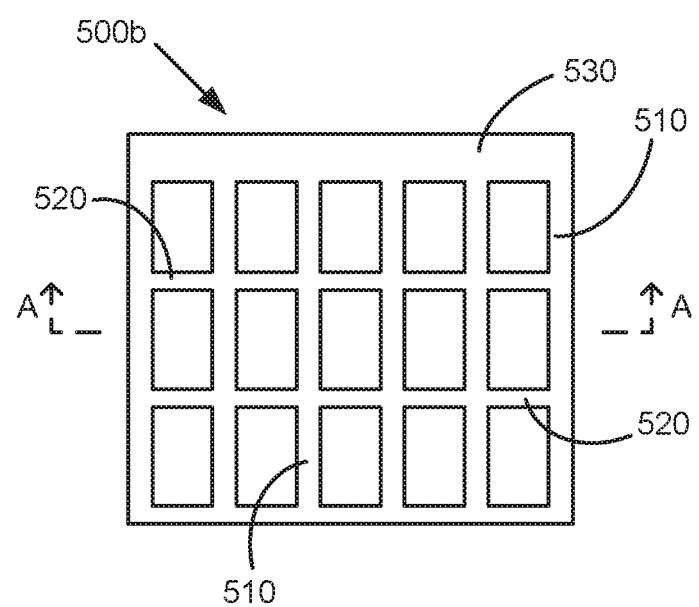

FIGS. 3A and 3B illustrate top views of example metal layers 500a and 500b that may be produced by the electroforming mandrels described herein. Metal layers 500a and 500b include electroformed elements embodied here as substantially parallel fingers 510, which have been formed by substantially parallel grooves in an electrically conductive mandrel. Metal layer 500b also includes electroformed elements embodied here as horizontal fingers 520 that intersect vertical fingers 510, where the fingers 510 and 520 intersect at approximately a perpendicular angle. In other embodiments, fingers 510 and 520 may intersect at other angles, while still forming a continuous grid or mesh pattern. Metal layers 500a and 500b also include a frame element 530 which may serve as a bus bar to collect current from the fingers 510 and 520. Having a bus bar integrally formed as part of the metallic article can provide manufacturing improvements. In present high-volume methods of solar module production, cell connections are often achieved by manually soldering metal ribbons to the cells. This commonly results in broken or damaged cells due to manual handling and stress imparted on the cells by the solder ribbons. In addition, the manual soldering process results in high labor-related production costs. Thus, having a bus bar or ribbon already formed and connected to the metallization layer, as is possible with the electroformed metallic articles described herein, enables low-cost, automated manufacturing methods.

Frame element 530 may also provide mechanical stability such that metal layers 500a and 500b are unitary, free-standing pieces when removed from a mandrel. That is, the metal layers 500a and 500b are unitary in that they are a single component, with the fingers 510 and 520 remaining connected, when apart from a photovoltaic cell or other semiconductor assembly. Frame element 530 may furthermore assist in maintaining spacing and alignment between finger elements 510 and 520 for when they are to be attached to a photovoltaic cell. Frame element 530 is shown in FIGS. 3A-3B as extending across one edge of metal layers 500a and 500b. However, in other embodiments, a frame element may extend only partially across one edge, or may border more than one edge, or may be configured as one or more tabs on an edge, or may reside within the grid itself. Furthermore, frame element 530 may be electroformed at the same time as the fingers 510 and 520, or in other embodiments may be electroformed in a separate step, after fingers 510 and 520 have been formed.

Although the mandrels disclosed herein are shown for forming single metallic articles or electroformed elements, the mandrels may also be configured to form multiple articles. For example, a mandrel may include patterns to form more than one metallic article 500a or 500b, such as to create a desired number of electrical conduit grids for a complete solar array.

Metallic articles fabricated by an electroforming mandrel enable features to be tailored even further to meet desired functional and manufacturing needs of a particular photovoltaic cell, such as is disclosed in U.S. Pat. No. 8,936,709, owned by the assignee of the present application and hereby incorporated by reference. For example, individual shapes of elements within the metallic article can be custom-designed, or elements in one region of the metallic article can be designed with features geometrically different from elements in another region. The customized features may be used individually or in combination with each other. The use of an electroforming mandrel decouples dimensional constraints of the overall electroformed piece so that the features may be optimized for a particular area within the metallic article.

Figure 4:
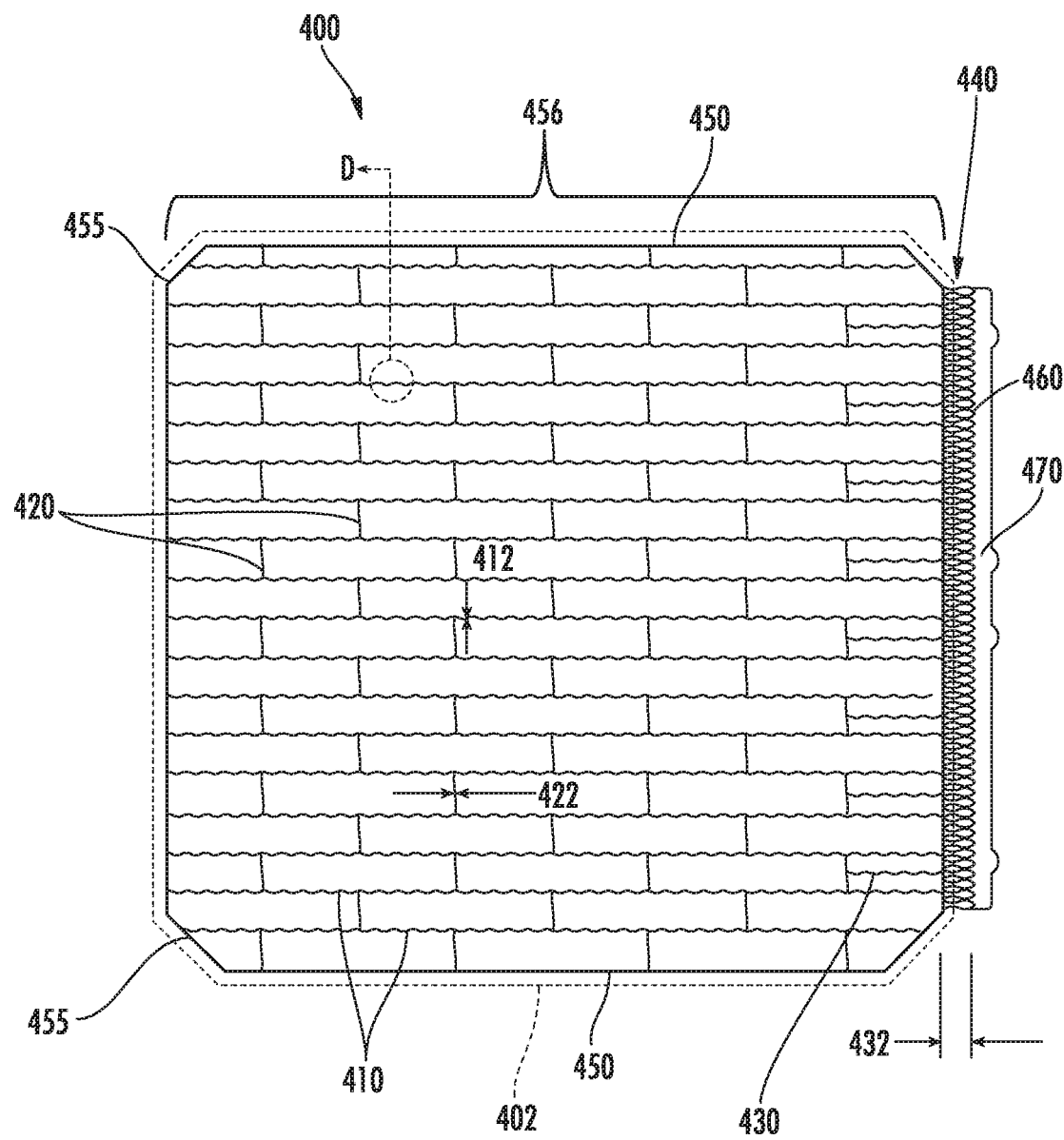
FIG. 4 provides a top view of a metallic article with adaptable features, in one embodiment.

FIG. 4 shows a top view of a metallic article 400 of the present disclosure with embodiments of various features adapted for a photovoltaic cell. A semiconductor substrate 402 is shown in dashed lines to demonstrate the placement of metallic article on a photovoltaic cell, where the metallic article 400 is configured here as a grid for the front side of the cell. However, the features described herein may be applied to an electrical conduit for the back side of a photovoltaic cell. In this disclosure, reference to semiconductor materials in formation of a semiconductor device or photovoltaic cell may include amorphous silicon, crystalline silicon or any other semiconductor material suitable for use in a photovoltaic cell. The metallic articles may be also applied to other types of semiconductor devices other than photovoltaic cells. Semiconductor substrate 402 is shown in FIG. 4 as a mono-crystalline cell with rounded corners, also referred to as a pseudosquare shape. In other embodiments, the semiconductor substrate may be multi-crystalline, with a fully square shape. Semiconductor substrate 402 may have electrical conduit lines (not shown) on its surface, such as silver fingers, that carry current generated by substrate 402.

The metallic article 400 includes a first region 456 having a plurality of electroformed elements that are configured to serve as an electrical conduit for a light-incident surface of the photovoltaic cell. A cell-to-cell interconnect 440 is integral with the first region 456. Silver fingers may be screen-printed onto the semiconductor substrate 402 according to conventional methods. For example, the silver fingers may be lines that are perpendicular to the direction of grid lines 410 in the first region 456. The elements of metallic article 400 then serve as electrical conduits to carry electrical current from the silver fingers. In this embodiment of FIG. 4, grid lines 410 (in the horizontal direction in FIG. 4) and segments 420 (in the vertical direction in FIG. 4) in the first region 456 of metallic article 400 are electrically coupled to the semiconductor substrate 402, such as by soldering, to collect and deliver the current to the interconnection element or cell-to-cell interconnect 440. Grid lines 410 may be perpendicular to the edge of the first region 456. Cell-to-cell interconnect 440 enables cell-to-cell connections for a solar module to create a solar array. Fabricating metallic article 400 with a metal such as copper reduces the cost compared to a cell in which silver is used for all the electrical conduits, and can also improve cell efficiency due to improved conductivity.

The plurality of electroformed elements may comprise a plurality of first elements intersecting a plurality of second elements. For example, the grid lines 410 and segments 420 of FIG. 4 are shown as intersecting and approximately perpendicular to each other; however, in other embodiments they may be at non-perpendicular angles to each other. Although both the grid lines 410 and segments 420 are capable of carrying electrical current, grid lines 410 provide the path of least resistance to interconnection element 440 and would function as the primary carriers of electrical current. Segments 420 provide mechanical support for the free-standing metallic article 400, both in terms of strength and in maintaining dimensional specifications of the grid. However, segments 420 can also serve as electrical conduits, such as in providing redundancy if grid lines 410 should fail. In some embodiments, grid lines 410 and segments 420 may have widths 412 and 422, respectively, that differ from each other such as to optimize mechanical strength or achieve a desired fill factor for the cell. For example, width 412 of grid lines 410 may be smaller than width 422 of segments 420, so that segments 420 provide sufficient mechanical stability for metallic article 400 while grid lines 410 are tailored to achieve as high a fill factor as possible. In further embodiments, certain grid lines 410 may have different widths than other grid lines 410, such as to address mechanical strength or electrical capacity of a particular zone. The pitch of grid lines 410 may also vary from the segments 420, or may vary from each other in different regions within metallic article 400 to meet required device conduction requirements. In some embodiments, a coarser or finer mesh pitch may be chosen based on, for example, the silver finger designs of the wafer, the precision of the silver screen printing process, or the type of cell being used.

In another embodiment, the pattern of the elements to collect and deliver the current to an interconnection element in the first region 456 of metallic article 400 may consist of grid lines (in the horizontal direction) and grid lines (in the vertical direction) which are electrically coupled to the semiconductor substrate 402. The grid lines in the vertical direction may differ from the segments 420 in FIG. 4 in that the grid lines in the vertical direction run from one edge member 450 of the metallic article 400 to the other edge member 450 of the metallic article 400 and are substantially perpendicular to the horizontal grid lines. The horizontal grid lines and the vertical grid lines form a mesh configuration.

Further features that may be tailored may be designed into the electroforming mandrel in which the metallic article is fabricated. For example, the metallic article may have intersecting grid lines forming a mesh configuration over the majority of the first region 456 of the metallic article. The grid lines may have a width that is non-uniform along its length. In one embodiment, the width of the horizontal grid line is wider nearer the interconnect element (or cell-to-cell interconnect 440), which is the current collection end of the cell. This increased width accommodates the higher electrical current at this end, as current is gathered by the metallic article across its surface of the first region 456. Thus, the increased width reduces resistive losses. The height of the grid line may also be adjusted as desired in the areas of increased width.

Moreover, the lengthwise profile may be altered in shape in addition to varying in width. The horizontal and vertical grid lines may be configured with a non-linear pattern that allows the grid lines to expand lengthwise, thus serving as an expansion segment. In one embodiment, the both the horizontal and vertical grid lines may have a wave-type pattern with curved elements, as exemplified by grid lines 410 and segments 420. The wave pattern may be configured as, for example, a sine-wave or other curved shape or geometries. The wave pattern may provide extra length between solder points to allow the metallic article to expand and contract, such as to provide strain relief for differences in coefficients of thermal expansion (CTE) between metallic article and the semiconductor substrate to which it is joined. For example, a copper has a CTE of around five times that of silicon. Thus, a copper metallic article soldered to a silicon substrate will experience significant strain during heating and cooling steps involved with manufacturing the sub-assembly into a finished solar cell. In other embodiments only certain grid lines may be configured as expansion segments. In yet further embodiments, only a certain portion of a single grid line may be configured as an expansion segment, while the remainder of the length is linear.

In the embodiment of FIG. 4, the grid lines 410 have a wave-type pattern. Also, the segments 420 have a wave-type pattern. Near the cell-to-cell interconnect 440, additional horizontal sections 430 may be present. The additional horizontal sections 430 provide additional current carrying capability. In other embodiments, the grid lines 410 and segments 420 may be linear or be a combination of wave-type pattern and linear. Grid lines 410 and segments 420 also include edge members 450 and 455, which are configured to be located near the perimeter of a solar cell. For instance, the edge members 450 and 455 may be located 1-3 mm from the edges of the wafer 402. Because edge members 450 and 455 form the perimeter of metallic article 400, edge members 450 and 455 may be wider than other grid lines 410 and segments 420 in the interior of metallic article 400, to provide additional structural support. Edge members 455 are configured as corner bus bars in the embodiment of FIG. 4, that form an angle from the main edge member 450. That is, edge member 450 has a change in conduit direction along the length, such as to accommodate a pseudosquare shape in this embodiment. This change in direction can be integrally formed by the electroforming mandrel, and can include tailoring the width of the corner bus bar 455 for improving mechanical strength and reducing resistive losses. Wider bus bars 450 and 455 at the perimeter of metallic article 400 can also improve the bonding strength when attaching the metallic article 400 to the semiconductor substrate 402.

Figure 5A:
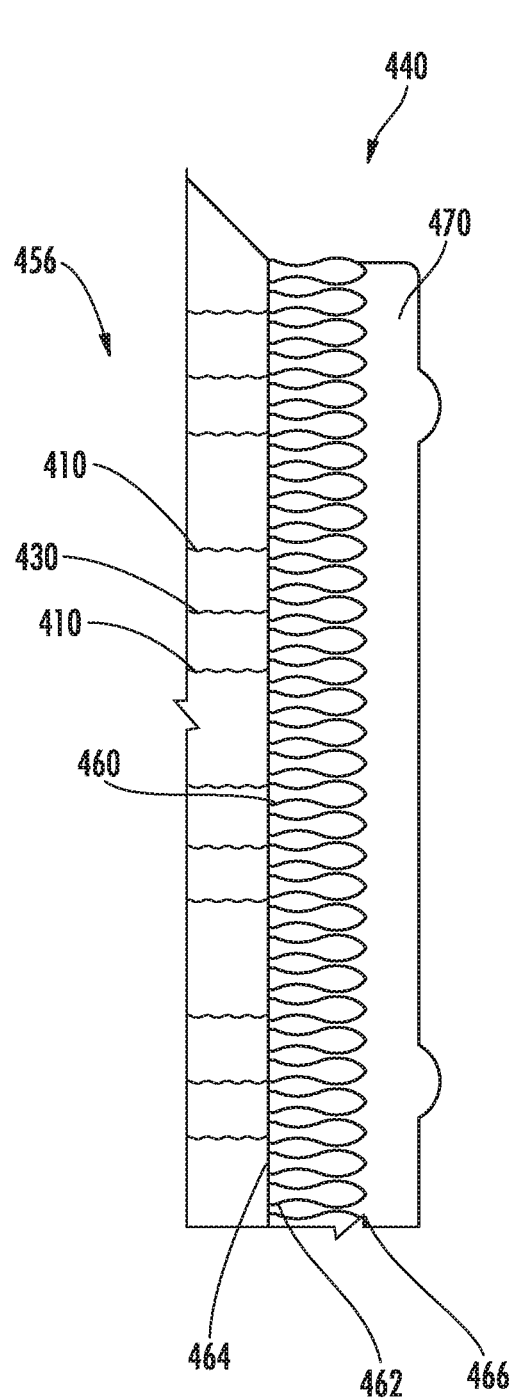
FIGS. 5A-5B are a close up view of a cell-to-cell interconnect in accordance with an embodiment.
Figure 5B:
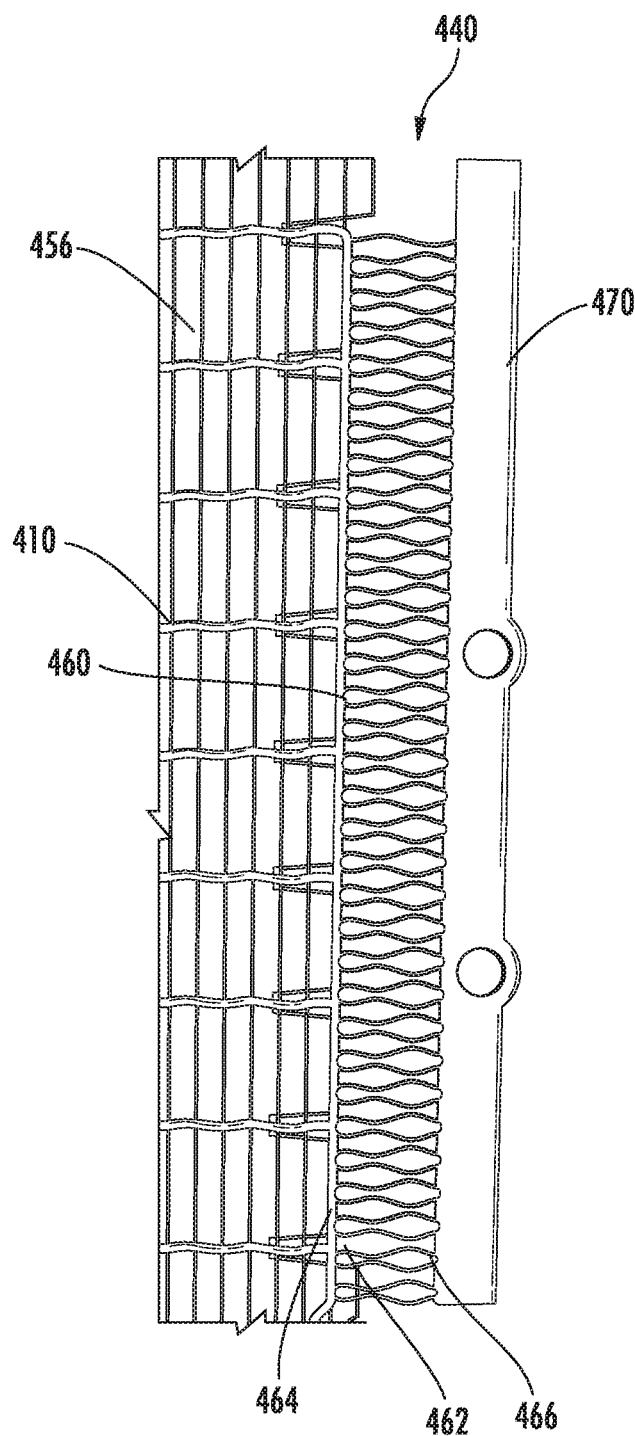

Cell-to-cell interconnect 440 is near an edge of the metallic article 400. The cell-to-cell interconnect 440 is integral with the first region 456. The cell-to-cell interconnect 440 is configured to extend beyond the light-incident surface of the first region 456 and to directly couple the metallic article 400 to a neighboring photovoltaic cell. FIGS. 5A and 5B are close-up views of different embodiments of a cell-to-cell interconnect. The cell-to-cell interconnect 440 includes a plurality of electroformed, curved appendages 460. Each appendage 460 has a first end 462 coupled to an edge 464 of the first region 456 and a second end 466 opposite the first end 462 and away from the edge 464. The appendages 460 are spaced apart from each other. By having neighboring appendages 460 spaced apart—that is, not joined together—stress relief is improved due to the independent flexion and thermal expandability of each appendage.

In one embodiment, the pattern of appendages 460 form an outline of an hourglass or bowling pin shape comprised of curved surfaces within the original plane of the cell-to-cell interconnect 440, with little to no sharp or straight edges or angles. Other shapes may be used which may be asymmetric, long and sinusoidal wave-like shapes. The curvature of the appendages 460 may be larger at one end 462 or 466, compared to the other end. The appendages 460 may be spaced apart from each other and the pattern of the appendages 460 may be repeated one after another in a head-to-tail fashion or in a head-to-head way. The appendages 460 may have a repeating or non-repeating pattern across the cell-to-cell interconnect 440. The appendages 460 enable lateral compliance and a spring-like structure for strain relief due to mechanical and thermal stresses. In the embodiment of FIG. 5B, the appendages 460 may be repeated 10 or more times per centimeter. The metallic article 400, including the first region and the cell-to-cell interconnect 440, may be electroformed on an electrically conductive mandrel and formed by a preformed pattern to form a unitary, free-standing piece when separated from the electrically conductive mandrel.

In one embodiment, the metallic article 400 further comprises a metallic strip 470 integral with the cell-to-cell interconnect 440 and coupled to the second ends 466 of the plurality of electroformed appendages 460. The metallic strip 470 is configured to be coupled to a back side of the neighboring photovoltaic cell. The metallic strip 470 of the cell-to-cell interconnect 440 serves as a solder pad for the back of an adjacent cell, while the appendages 460 serve as electrical conduits between solar cells. Note that the cell-to-cell interconnect 440 design has a large surface area compared to conventional solder ribbon, in which three bus ribbons are used. Consequently, the design of cell-to-cell interconnect 440 improves efficiency at the module level by providing low series resistance and minimal voltage drop. For example, the width 432 of the cell-to-cell interconnect 440 may be 5-10 mm, such as 6-8 mm, compared to a width of 50-100 μm for grid lines 410 and segments 420.

Figure 6A:
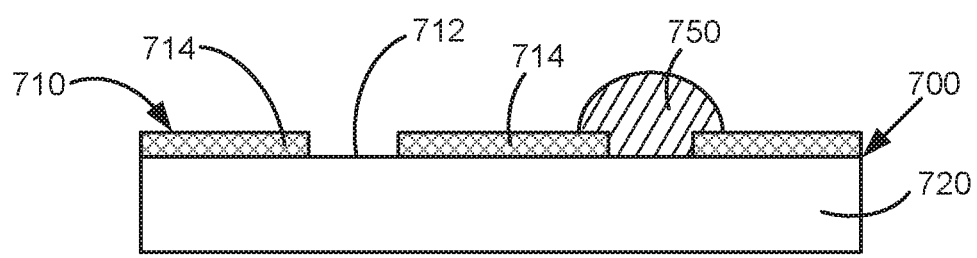
FIGS. 6A-6B show cross-sectional views of an example mandrel and corresponding electroformed element having an overplated portion.

FIG. 6A shows an example mandrel 700 having an outer surface layer 710, with exposed metal regions 712 and dielectric regions 714 covering portions of the metal substrate 720. The dielectric region 714 may be, for example, a fluoropolymer (e.g., Teflon®), a patterned photoresist (e.g., Dupont Riston® thick film resist), or a thick layer of epoxy-based photoresist (e.g., SU-8). The photoresist is selectively exposed and removed to reveal the desired pattern. In other embodiments, the dielectric region 714 may be patterned by, for example, machining or precision laser cutting. The use of dielectrics or permanent resists allows for reuse of the mandrel 700, which reduces the number of process steps, consumable costs, and increases throughput of the overall manufacturing process compared to consumable mandrels.

Figure 6B:
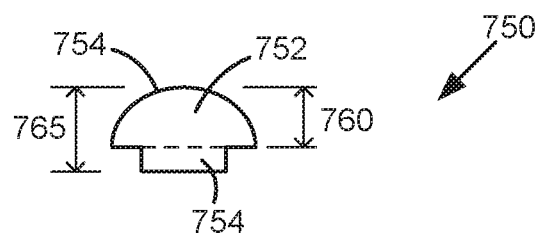

Also shown in FIG. 6A is an electroformed element 750. Electroformed element 750 is formed on exposed metal region 712, and is overplated onto outer surface layer 710 of mandrel 700. The overplating is the portion of the electroformed element that extends beyond the surface of the patterned dielectric layer. FIG. 6B shows electroformed element 750 when separated from the mandrel 700, where overplated portion 752 has a height 760 that spans a percentage of the overall height 765 of electroformed element 750. The overall height 765 includes the height 760 of overplated portion 752, as well as the height of stem portion 754 (as delineated by a dashed line). The height 760 of the overplated portion 752 may be a percentage of the overall height 765 of the electroformed element 750, where the percentage may vary in different embodiments. In some embodiments, the height 760 may span a majority, such as greater than 50%, of the overall height 765. In further embodiments, the height 760 may encompass the entire height 765 such that no stem region is present. The overplated configuration may provide optical advantages due to the rounded top surface 754 of overplated portion 752. Furthermore, top surface 754 may be designed to assist in reflection of light to enhance the efficiency of a solar cell. For instance, the top surface 754 may be textured to create a Lambertian surface, or in other embodiments the top surface 754 may be coated, such as with silver, to enhance specular reflection.

Figure 7:
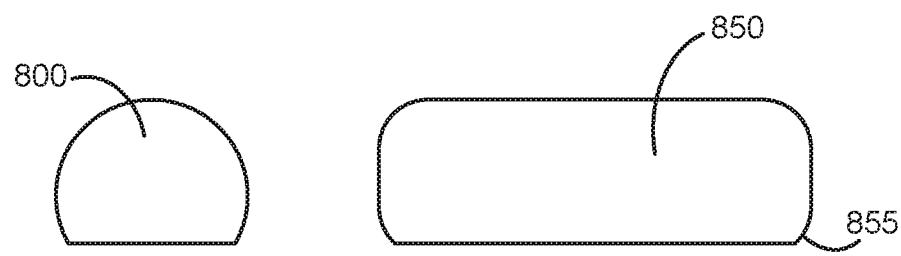
FIG. 7 shows cross-sections of example embodiments of overplated shapes.

The amount of electroforming and the dimensions of the exposed metal regions on the mandrel determine the extent of the electroformed shape that is formed. The deposition of metal is unconstrained by the mandrel, allowing overplating above the dielectric region of the outer surface layer. In the embodiments of 6A and 6B, the overplated portions are approximately hemispherical. FIG. 7 provides cross-sections of other example embodiments of overplated shapes that may be formed. In one embodiment, electroformed element 800 is a truncated circular cross-sectional shape, having more area than a hemisphere. This type of element 800 may be produced by, for example, increasing the electroforming time or current significantly compared to that for forming hemispherical overplated portion 752 of FIG. 6B. In another example, electroformed element 850 has a rectangular cross-section with rounded corners. This shape may be produced using, for example, a wider metal mandrel region compared to element 800. Bottom corners 855 may also be slightly rounded due to the nature of the electroplating process.

The shape of the overplated portions in the present disclosure can be further modified by the use of pulsed plating techniques, shielding of portions of the anode or cathode, modifications to the shape and placement of the anode, adjustments to the anode/cathode distance, and modifications to the fluid flow impinging on the electroformed part such that the shape can be made narrower and taller allowing for a hyperbolic or elliptical shape and even permitting a narrowing of the protruding electroform such that a conical shape is approximated. In further embodiments, the overplated region can also be adjusted in shape through the use of resists of multiple heights. For example, a resist of greater height may be placed on one side of the open trench, in opposition to a resist of lower height—e.g., making resist 714 in FIG. 6A thicker on the left side of exposed portion 712 than the resist 714 on the right side of exposed portion 712. In such an example, the overplated section will show a hemispherical surface on one side of the plated area (i.e. the lower side), but will have a flat alternate side opposing the thicker resist. This double resist method can also be used to create other effects, for example, clean hole formation, or dimpling, in the produced part.

Figure 8:
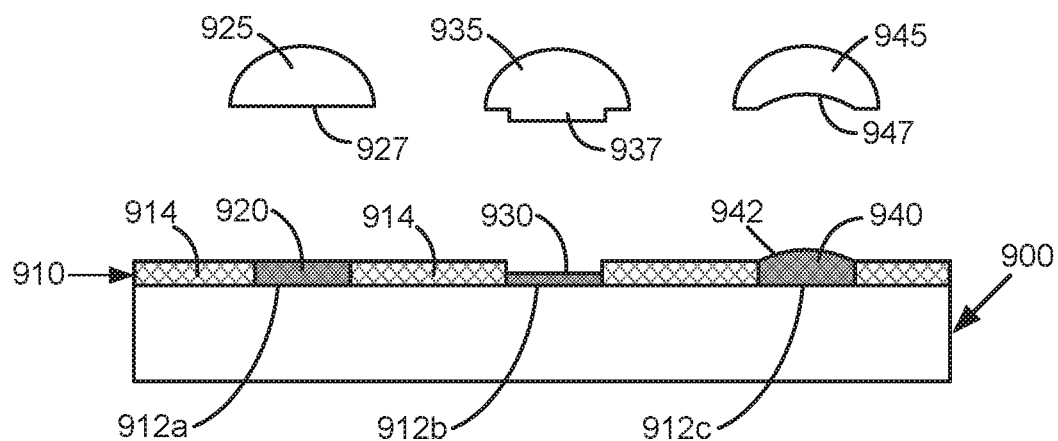
FIG. 8 provides a cross-sectional view of embodiments of template metals that may be plated onto an electroforming mandrel, and embodiments of electroformed pieces that may be produced.

FIG. 8 illustrates other electroforming embodiments in which a template metal may be plated onto the mandrel 900, to at least partially fill grooves formed by the exposed metal regions and dielectric regions in the outer surface layer of the mandrel. In one embodiment, template metal 920 is plated to fill the groove defined by exposed metal region 912a and surrounding dielectric regions 914, so that template metal 920 is approximately flush with the top of outer surface layer 910 of mandrel 900. Electroformed element 925 illustrates an example piece that will be produced by overplating on the template metal 920, in which a flat bottom surface 927 is created. That is, electroformed element 925 is absent of a stem portion (e.g., stem portion 754 of FIG. 6B) due to template metal 920 being flush with outer surface layer 910. Thus, the overplated portion comprises the entire height of the electroformed element 925. In another embodiment, template metal 930 partially fills the groove over exposed metal region 912b to produce an electroformed element 935 having a shorter stem portion 937 compared to stem portion 754 of FIG. 6B where no template metal is in the mandrel groove. In a yet further embodiment, a template metal 940 is slightly overfilled in the groove of exposed metal region 912c, so that template metal 940 forms an upper surface 942 having a convex contour. As a result, electroformed element 945 that is formed on template metal 940 has a concave bottom surface 947. The non-planar bottom surface 947 may provide benefits such as allowing solder to wick underneath electroformed element 945 when being joined to a solar cell, thus increasing the joint strength due to the increased amount of solder or other adhering material.

Thus, FIG. 8 demonstrates that employing a template metal such as 920, 930 or 940 at the electroforming regions of the electroforming mandrel can impart specific shapes to the electroformed elements. The template metal is electrically conductive, allowing metal elements to be electroformed thereon, but also may have poor adhesion with the electroformed element, which permits removal of the electroformed articles while the template metal remains on the mandrel. Thus, the template metal can remain in the mandrel and be reused after a metallic article has been produced and removed from the mandrel. Template metal may be, for example, nickel, copper, tin, lead, tin/lead, silver, or gold, and may be deposited using standard electroforming techniques. In certain embodiments, the template metal may be chosen to protect the mandrel material from the environment or from chemicals used in the electroforming process. The template metal may also be used to protect the interface between the dielectric and exposed metal portion of mandrel. In further embodiments, the interface between the patterned dielectric and mandrel substrate can be protected from the environment by patterning a second dielectric at the interface. The template metal can also help prevent delamination of the dielectric by locking it in place. The template metal can also be deposited by vacuum coating techniques to allow for the deposition of metals such as titanium and stainless steel which will provide a low adhesion surface, facilitating the release of the metallic article and better protecting the interface between the dielectric and the mandrel substrate. In this case the template metal may require a second patterning step to confine it to the exposed metal region of the mandrel. Another common base metal application used in electroforming is electroless deposition, which is commonly used for placing metal for replication on complicated surface geometries. This method can also be used for creating the base metal for the mandrels discussed herein.

Figure 9A:
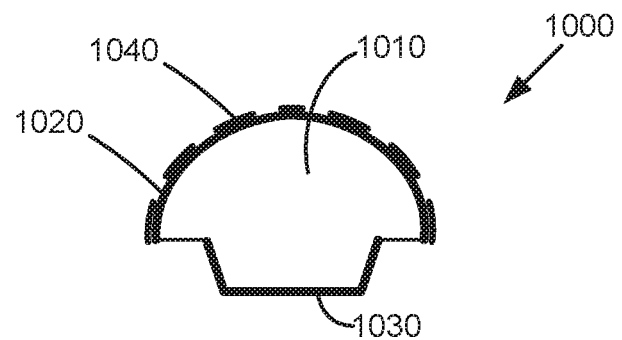
FIGS. 9A-9B are cross-sectional views of example layers that may be plated on electroformed elements.
Figure 9B:
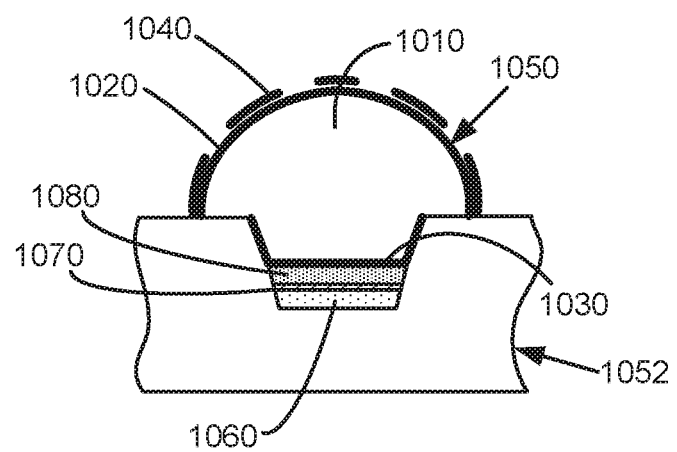

FIGS. 9A and 9B describe various layers that may be included on electroformed elements using the present methods. In FIG. 9A, an electroformed element 1000 has a bulk conductor material 1010, such as copper, with a barrier layer 1020 plated onto a top surface of the bulk conductor 1010, and a barrier layer 1030 plated on a bottom surface of the bulk conductor 1010. The bottom surface of electroformed element 1000 is configured to be facing the photovoltaic cell, such as providing a surface for attachment. The material for barrier layers 1020 and 1030 prevents corrosion of copper, and may be, for example, nickel, nickel boron, silver, tin, or tin-lead alloys. Electroformed element 1000 is fabricated by plating barrier layer 1030 in the mandrel, forming bulk conductor 1010 over barrier layer 1020, and then plating the top barrier layer 1020. Thus, barrier layers 1020 and 1030 surround bulk conductor 1010. In further embodiments, additional layers 1040 (indicated as a dashed line) may be deposited over barrier layer 1020. For example, layer 1040 may be a solder, which can later reflow and bond to screen-printed silver fingers on a photovoltaic cell for making electrical contact of the electroformed element 1000 to the cell. In other embodiments, layer 1040 may include a reflective material such as silver or tin, to enhance the optical properties of electroformed element 1000. For example, enhanced deflection and reflection provided by the top surface reduces the effective shading of the metallic article to less than its footprint.

FIG. 9B shows another embodiment of an electroformed element 1050, in which solder is applied to the bottom surface of an electroformed element rather than the top surface as in FIG. 9A. First, an initial layer 1060 is plated in the exposed metal region of mandrel 1052. Layer 1060 may be tin, lead, or any combination thereof. Next, a layer 1070 of copper is electrolessly deposited over layer 1060, such that the layers 1060 and 1070 are effectively part of the exposed metal region of the mandrel. The copper layer 1070 is deposited due to a reduction-oxidation reaction between copper sulfate and the metals of layer 1060 (tin, lead, or any combination of the two), and leaves a surface layer of loosely adhered copper on the top of the initial metal layer 1060. A solder layer 1080 is formed over copper layer 1070. The copper layer 1070 has poor adhesion to the solder, and therefore facilitates removal of electroformed element 1050 from mandrel 1052. The use of these metals in layers 1060-1080 for this purpose is contrary to known methods, because their reaction with copper has typically been seen as a negative feature during electroplating. The interaction of tin, lead, or any combination of the two, with copper produces a layer of very poorly adhered copper metal on the surface of the tin/lead. In conventional electroplating operations, this would eventually cause delamination of the electroplated part, and therefore is undesirable for conventional plating applications. In the present disclosure, the poorly adhered copper layer 1070 becomes an advantage, as it is able to create a release layer for whatever layer is being deposited over it, in this case, solder layer 1080.

Solder layer 1080 remains attached to the electroformed element 1050 when removed from the mandrel 1052. Barrier layer 1030 can, for example, then be plated onto the solder layer 1080, forming a bottom surface for bulk conductor 1010 as described for FIG. 9A. However, the plating of this layer 1030 is not required for attachment of the electroformed element 1050 to a photovoltaic cell. Bulk conductor 1010 is then formed, such as with an overplated configuration in this embodiment. Barrier layer 1020 may be plated over the top surface of bulk conductor 1010, and additional layer(s) 1040—such as a reflective material to achieve a desired surface finish—is deposited over barrier layer 1020. The electroformed element 1050 may then be separated from the mandrel 1052, as a free-standing metallic article.

Applying solder, such as layer 1040 in FIG. 9A or layer 1080 in FIG. 9B, to the electroformed element while the element is in the mandrel provides manufacturing benefits compared to performing a solder plating step after the electroformed article is removed or peeled from the mandrel. By applying the solder during electroforming of the metallic article, before removing the electroformed article from the mandrel, a separate plating tool for applying solder is eliminated from the process, thus reducing cost. In the embodiment of FIG. 9B, applying solder 1080 only on one side of electroformed element 1050, such as a second side, provides a further benefit by allowing the opposite surface (i.e., first side) of the electroformed element 1050 to be coated with a different material.

After separating the metallic article from the electroforming mandrel, the plurality of electroformed elements are interconnected such that the metallic article forms a unitary, free-standing piece when separated from the mandrel. It may be desirable to create a blackening of the plurality of electroformed elements for aesthetic concerns or additional functionality. For example, the first side of the plurality of electroformed elements are blackened after separating the metallic article from the mandrel.

Figure 10:
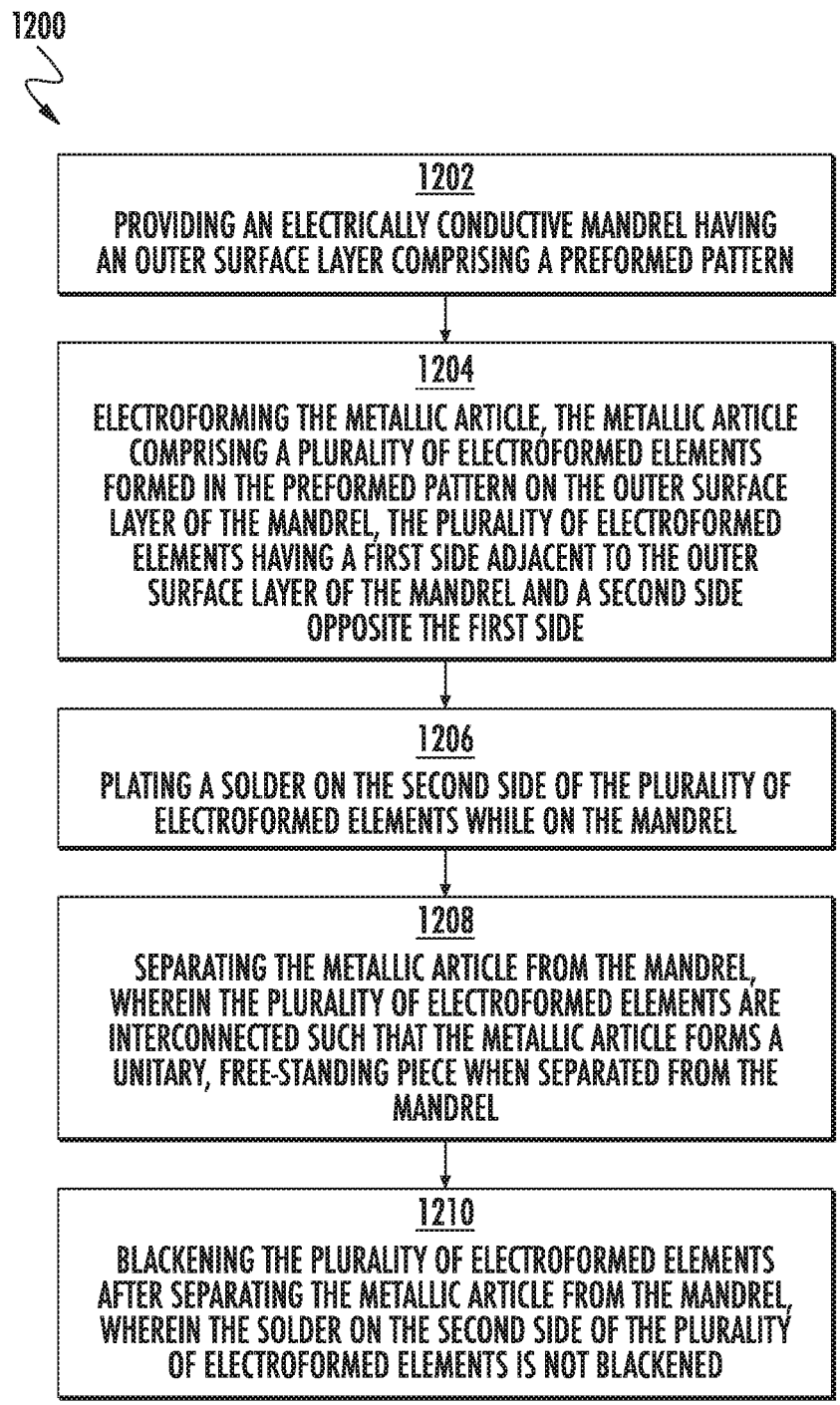
FIG. 10 is a simplified flowchart of a method for blackening a metallic article for a photovoltaic cell, in accordance with some embodiments.

FIG. 10 is a simplified flowchart of a method for blackening a metallic article 1200 for a photovoltaic cell, in accordance with some embodiments. At step 1202, an electrically conductive mandrel having an outer surface layer comprising a preformed pattern is provided. At step 1204, the metallic article is electroformed. The metallic article includes a plurality of electroformed elements formed in the preformed pattern on the outer surface layer of the mandrel. The plurality of electroformed elements have a first side adjacent to the outer surface layer of the mandrel and a second side opposite the first side. At step 1206, a solder is plated on the second side of the plurality of electroformed elements while on the mandrel. In some embodiments, the second side includes an overplated portion formed on the second side of the plurality of electroformed elements, and the solder is plated on the overplated portion on the second side, as disclosed herein.

At step 1208, the metallic article is separated from the mandrel. The plurality of the electroformed elements are interconnected such that the metallic article forms a unitary, free-standing piece when separated from the mandrel. At step 1210, the first side of the plurality of electroformed elements is blackened after separating the metallic article from the mandrel. The solder on the second side of the plurality of electroformed elements is not blackened.

Figure 11:
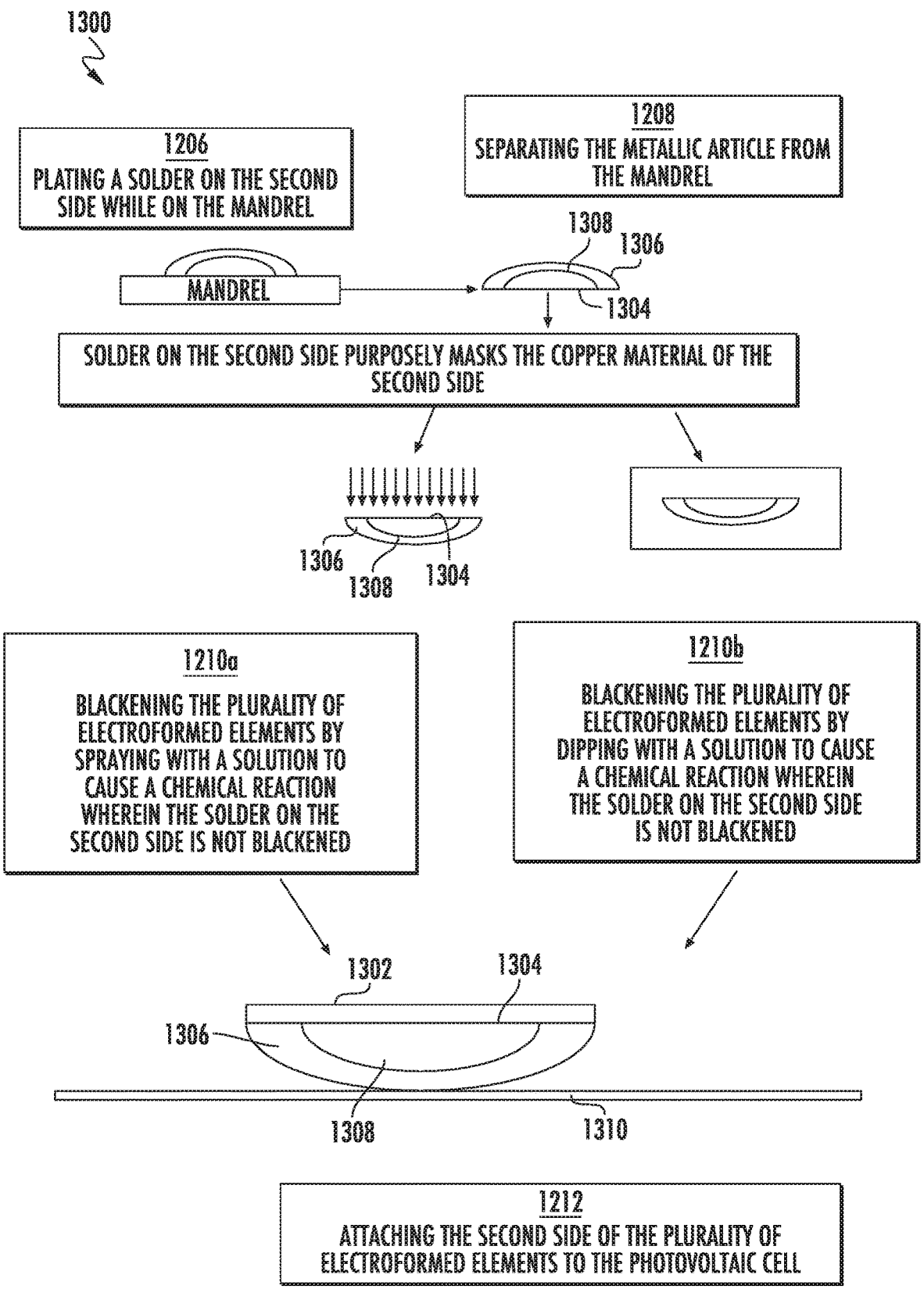
FIG. 11 is a flowchart with schematic representations of the method for blackening a metallic article for a photovoltaic cell, in accordance with some embodiments.

FIG. 11 is a flowchart with schematic representations of the method 1300 for blackening a metallic article for a photovoltaic cell, in accordance with some embodiments. After the electroformed elements of the metallic article are electroformed in the mandrel using for example a copper material, the pattern of a grid is created corresponding to the preformed pattern of the mandrel. The electroformed elements have a first side 1304 adjacent to the outer surface layer of the mandrel and a second side 1308 opposite the first side 1304. At step 1206, solder 1306 is plated to the second side 1308 of the electroformed elements. At step 1208, the grid, or metallic article is separated from the mandrel. The solder 1306 on the second side 1308 of the electroformed elements purposely masks the copper material of the second side 1308 of the electroformed elements so the blackening does not occur on the second side 1308 of the electroformed elements. The second side 1308 of the plurality of electroformed elements of the metallic article, or the solder side of the metallic article, is adjacent to the photovoltaic cell when attached together.

To create the blackening, at steps 1210a or 1210b, the metallic article may be sprayed with a solution (step 1210a) or dipped in the solution (step 1210b) to cause a chemical reaction resulting in the blackening. In some embodiments, the entire metallic article is dipped in the solution. In other embodiments, a portion of the metallic article is dipped in the solution. The terms "submerging" or "immersion" described herein may refer to the entire metallic article being dipped in the solution or a portion of the metallic article being dipped in the solution.

The metallic article may be placed into or on a carrier then the height of the metallic article that is dipped into the solution is controlled so that only the first side 1304 of the plurality of electroformed elements of the metallic article is dipped in the solution. In other embodiments, the entire metallic article is dipped in the solution. At step 1212, the second side 1308 of the plurality of electroformed elements of the metallic article is attached to a photovoltaic cell 1310. For example, the electroformed element 2100 of the metallic article has the blackening 1302 on the first side 1304 and solder 1306 on the second side 1308. The solder 1306 of the second side 1308 is adjacent to the photovoltaic cell 1310 and the two are attached together.

When using a particular chemical mixture in the dipping or spraying process, the chemicals cause a reaction with the exposed material—copper—on only the first side of the electroformed elements because the solder layer covers the copper material on the second side of the electroformed elements. In this way, only the first side of the electroformed elements where the copper is present transforms to be blackened. The solder on the second side of the plurality of electroformed elements masks or covers the copper therefore, no chemical reaction occurs with the solder and the second side is not blackened.

Figure 12:
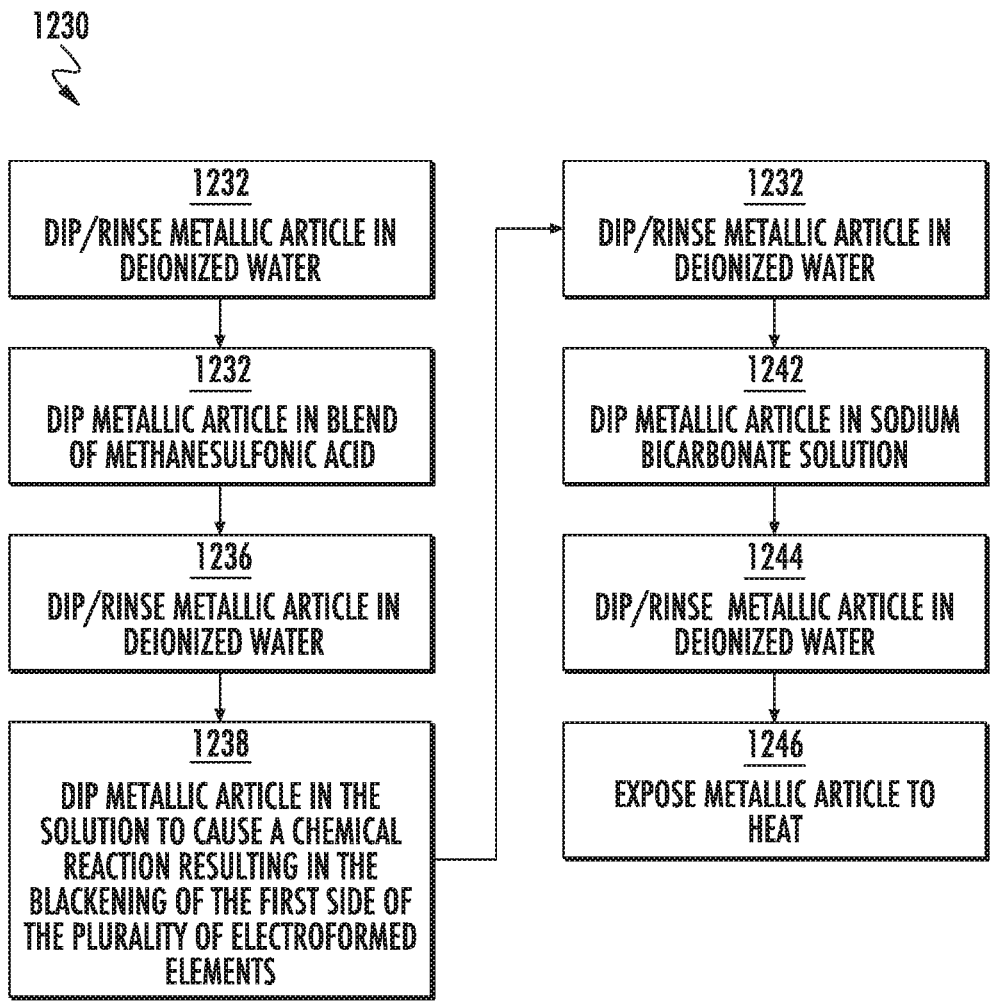
FIG. 12 is a simplified flowchart for a method of submerging a metallic article by a dipping process, in accordance with some embodiments.

In some embodiments, the blackening of the first side of the plurality of the electroformed elements is by the dipping (e.g., partial or full dipping, submerging or immersion) process. FIG. 12 is a simplified flowchart for the method of submerging a metallic article 1230 by a dipping process, in accordance with some embodiments. FIG. 12 describes more detailed step for performing step 1210*b* in FIG. 11. For example, at step 1232, after the metallic article is separated from the mandrel, the metallic article may be placed in or on a carrier and dipped and/or rinsed with deionized water for a short time, such as 5 seconds. At step 1234, the metallic article may be dipped in a blend of 3% to 7% methanesulfonic acid or the like for approximately 60 seconds to prepare the surfaces for blackening. At step 1236, the metallic article is dipped and/or rinsed with deionized water for 60 to 120 seconds.

At step 1238, the metallic article is dipped in the solution to cause a chemical reaction resulting in the blackening of the first side of the plurality of electroformed elements. The solution may be comprised of a mixture of ingredients such as shown in FIG. 13. Solution A of FIG. 13 details an example solution without an electrical current applied. The solution may be comprised of a mixture of fluoboric acid, cupric sulfate, selenious acid, phosphoric acid, nickel sulfate and water, where the solution does not require the use of an electrical current to cause the blackening reaction to occur. The sulfates produce cupric oxide when reacting with the metallic article 1220 to form the blackened layer. In other embodiments, a black electroless nickel process may be used. Solution B may include a mixture of nickel ions such as nickel sulfate, nickel chloride, nickel sulfamate, nickel acetate, or nickel hypophosphite, reducing agents such as sodium hypophosphite or sodium borohydride, complexing agents, neutralizers such as ammonium hydroxide or sodium hydroxide, a stabilizer such as lead, and a brightener such as calcium.

In other embodiments, the solution may be comprised of a mixture of water and a potassium sulfide family producing primarily cupric sulfide or cuprous sulfide when reacting with the copper metallic article 1220 to form the blackened layer. Solution C details an example solution without an electrical current applied. The copper metallic article 1220 is combined with water and the potassium sulfide family ($K_2S$) which may include sulfide, polysulfide, thiosulfate and bisulfide of varying amounts. For example, Liver of Sulfur (LOS) may be used as the potassium sulfide family. The ingredients in the solution and the solution itself may be in the form of a gel, liquid or pellet. The solution may be held at a particular temperature and the metallic article 1220 may be immersed for a particular amount of time. The concentration of the solution, the temperature of the solution and the amount of time of exposure in the solution such as by dipping are related and various combinations of these factors may be utilized. The metallic article 1220 may also be partially immersed in the solution so that only specific locations of the article are blackened. In some embodiments, portions or areas of the metallic article 1220 may be masked before dipping in the solution.

In various embodiments, during the blackening of the metallic article 1220 by dipping with the potassium sulfide solution, the temperature of the solution may range from 20° Celsius to 100° Celsius, and the amount of time immersed in the solution may range from 45 seconds to 140 seconds. In some embodiments, the metallic article 1220 may be dipped for approximately 60 seconds. Generally, a higher concentration of the solution may be a trade off with less time to cause the blackening reaction, and a higher temperature of the solution may be a trade off with less time to cause the blackening reaction. Agitation and/or circulation of the may be used in the method. Implementing agitation and/or circulation in the process may ensure that the chemical concentration is uniform in the solution and the processed materials are dispersed uniformly in the solution. The exact parameters may be chosen based on the desired results such as how dark of a color to achieve and the compatibility with the specific materials used in the solar module. Sulfide solutions can beneficially be more resistant to acetic acid, which can be produced by encapsulants such as EVA and can cause degradation of the blackened layer over time.

In some embodiments, when the parameters were too high, such as at higher temperatures, a dark black color was produced but lead-tin staining occurred on the metallic article 1220, and the blackening produced by the chemical reaction exhibited shedding or flaking of "black" particles. By these findings, the parameters of the concentration of the solution, temperature of the solution and amount of time immersed may be manipulated to produce the desired color with no change in appearance over time such as by fading, flaking or delamination.

Solution D is an example solution with an electrical current applied. The solution may be comprised of a mixture of ammonium sulphate, nickel sulphate, zinc sulphate and sodium sulphocyanide, and an electrical current may be applied. The solutions described above cause a chemical reaction with the material of the electroformed element, such as copper, and the first side of the electroformed element where the copper is present, is blackened while the second side of the electroformed element where the solder is present, is not affected. This mixture of the solution may be adjusted for different materials of the plurality of the electroformed element in order to have this desired effect. That is, solutions other than those shown in FIG. 13.

Referring to FIG. 12, at step 1240, the metallic article is dipped or rinsed with water such as deionized water for 10 seconds to 70 seconds to remove residual chemicals. At step 1242, the metallic article may be dipped in an aqueous blend of sodium bicarbonate and water, such as 30 grams of sodium bicarbonate for 1 liter of deionized water, for approximately 60 seconds. This passivates or neutralizes the blackening reaction. At step 1244, the metallic article is dipped or rinsed with water such as deionized water for 60 to 120 seconds. At step 1246, the metallic article is exposed to heat, such as at 80 to 120 degrees Celsius for 60 to 120 seconds to cure or dry the blackened metallic article. This particular temperature will not melt the solder on the second side of the electroformed elements. Alternatively, the metallic article may be dried by using an absorbent material.

Figure 14:
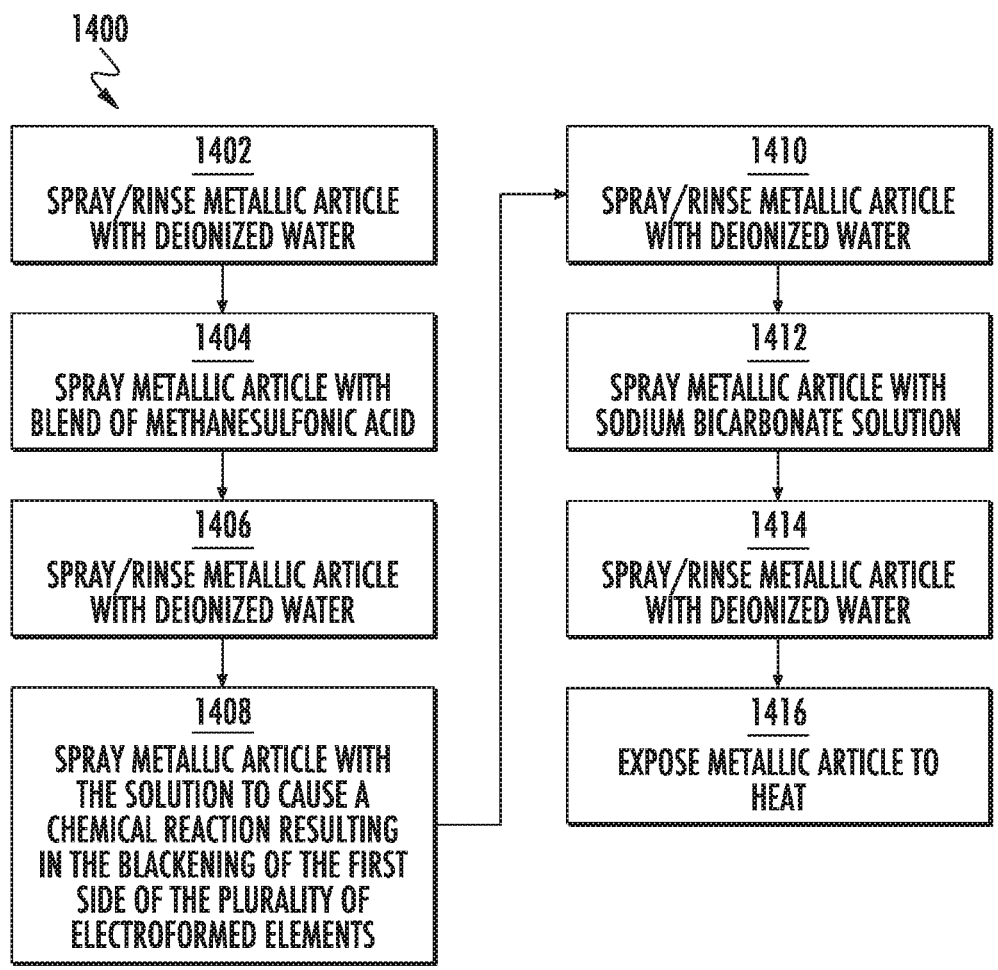
FIG. 14 is a simplified flowchart for a method of spraying the metallic article, in accordance with some embodiments.

In some embodiments, the blackening of the first side of the plurality of the electroformed elements is by a spraying process. FIG. 14 is a simplified flowchart of details for step 1210*a* from FIG. 11 for a method of spraying the metallic article 1400, in accordance with some embodiments. This method may have the same steps or similar steps as submerging the metallic article 1230 by the dipping process but instead of dipping the metallic article in the solution to cause the blackening process, the metallic article is sprayed with the solution to cause the blackening process. For example, in step 1402, after the metallic article is separated from the mandrel, the metallic article may be placed in or on a carrier and sprayed and/or rinsed in deionized water for a short time, such as 5 seconds. At step 1404, the metallic article may be sprayed in a blend of 3% to 7% methanesulfonic acid or the like for approximately 60 seconds to prepare the surfaces for blackening. At step 1406, the metallic article may be sprayed or rinsed in deionized water for 60 to 120 seconds.

At step 1408, the first side of the plurality of electroformed elements of the metallic article is sprayed with the solution to cause a chemical reaction resulting in the blackening of the first side of the plurality of electroformed elements. The solution may be, for example, sulfate-based (e.g., the solution as defined in Solution A in FIG. 13) or sulfide-based as defined in Solution C in FIG. 13. When the solution is applied such as by spraying, a chemical reaction occurs with the material of the electroformed element, such as copper, and the first side of the plurality of electroformed elements are blackened. In some embodiments, the metallic article 1220 may also be partially sprayed with the solution so that only specific locations of the article are blackened. Solder is layered on top of the copper on the second side of the electroformed element so no chemical reaction can occur and the second side of the electroformed element is not blackened.

At step 1410, the metallic article is sprayed or rinsed with water such as deionized water for 10 seconds to 70 seconds to remove residual chemicals. At step 1412, the metallic article may be sprayed with an aqueous blend of sodium bicarbonate and water or other neutralizing/passivation solutions (i.e., such as 30 grams of sodium bicarbonate for 1 liter of deionized water) for approximately 60 seconds. At step 1414, the metallic article is sprayed or rinsed with water such as deionized water for 60 to 120 seconds. At step 1416, the metallic article exposed to heat to cure and dry. The temperature may be 80 to 120 degrees Celsius for 60 to 120 seconds. Alternatively, the metallic article may be dried by using an absorbent material.

In some embodiments, the method may involve all dipping steps as in the method 1230, all spraying steps as in method 1400, or a method with a combination of spraying and dipping steps. Moreover, some of the steps may be optional and omitted.

Figure 15:
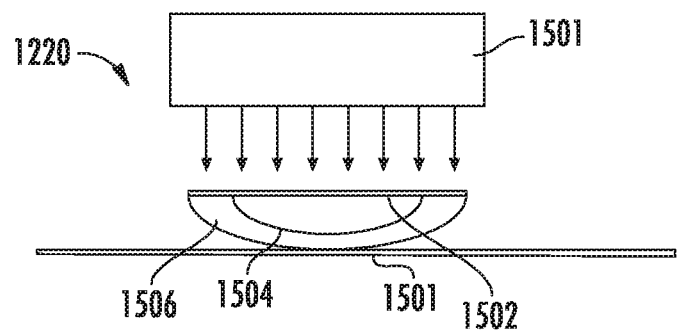
FIG. 15 is a schematic of the metallic article during the spraying process, in accordance with some embodiments.

FIG. 15 is a schematic of the metallic article during the spraying process, in accordance with some embodiments. During the spraying process, the metallic article 1220 may be placed on a working surface 1501 with the first side 1502 of the electroformed element facing toward a spraying source 1503 and the second side 1504 of the electroformed element with the solder 1506 adjacent to the surface and thereby unexposed. In this way, the solution may be sprayed conveniently on the first side 1502 of the electroformed element.

Figure 16:
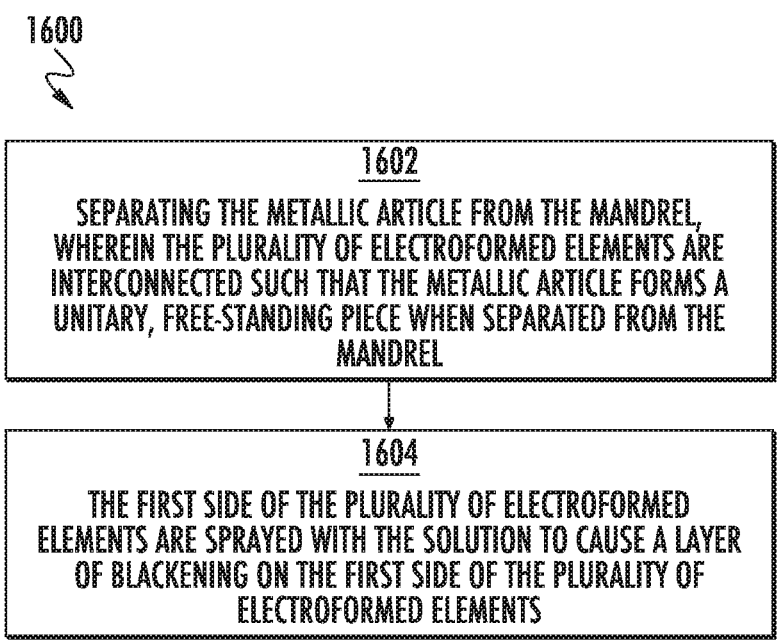
FIG. 16 is a simplified flowchart for a method of spraying the metallic article, in accordance with some embodiments.

In some embodiments, the blackening of the first side of the plurality of the electroformed elements is by a spraying process to add a black layer to the metallic article. FIG. 16 is a simplified flowchart for a method of spraying the metallic article 1600, in accordance with some embodiments. For example, in step 1602, the metallic article is separated from the mandrel and the plurality of the electroformed elements are interconnected such that the metallic article forms a unitary, free-standing piece. The metallic article may be dipped or sprayed in deionized water (optional, not shown) to prepare for coating. In step 1604, the first side of the plurality of electroformed elements is sprayed with the solution to cause a layer of blackening to be coated on the first side of the plurality of electroformed elements as opposed to a chemical reaction. The solution may be, for example, a paint. The paint may be common spray paint capable of withstanding high temperatures, such as up to 2000 degrees Celsius (or other temperature requirement for the environment in which the solar cell will be used), that is rust and corrosion resistant. The thickness of the blackening layer may be greater than 0.1 microns, or enough such that it darkens the surface of the grid sufficiently. Black layers above 10 microns may be slow to achieve. In other embodiments, the paint may be applied by rolling, brushing, sponging or the like instead of spraying.

Figure 17:
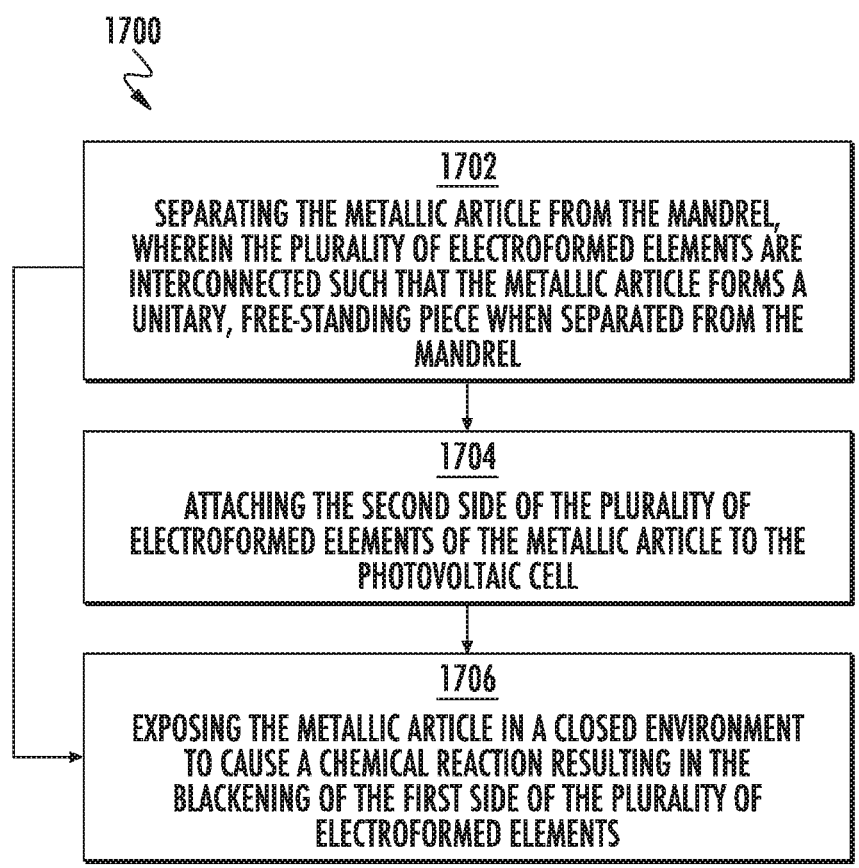
FIG. 17 is a simplified flowchart for a method of blackening the metallic article, in accordance with some embodiments.

In some embodiments, the blackening of the first side of the plurality of the electroformed elements is achieved by exposing the metallic article in a closed environment. FIG. 17 is a simplified flowchart for a method of exposure of the metallic article 1700, in accordance with some embodiments. For example, in step 1702, the metallic article is separated from the mandrel and the plurality of the electroformed elements are interconnected such that the metallic article forms a unitary, free-standing piece. The method may continue directly to step 1706. In step 1706, the metallic article is exposed in a closed environment to cause a chemical reaction resulting in the blackening of the first side of the plurality of electroformed elements. For example, the metallic article may be placed in the closed environment of a heat source, such as an oven or furnace, and heat is applied at 200 degrees Celsius to 600 degrees Celsius. An oxygen content within the closed environment may be, for example, 20% to 80% by volume. In this way, the material of the first side of the plurality of the electroformed elements, such as copper, is oxidized and the blackening forms. The time for the blackening to occur may be dependent on the temperature and oxygen content, where in general a higher temperature and/or a higher oxygen content reduces blackening time. For example, at 200 degrees Celsius and 20% oxygen content within the heat source, blackening occurs in approximately 60 minutes. Alternatively, at 600 degrees Celsius and 20% oxygen content in the closed environment, blackening occurs in approximately 60 seconds. In some embodiments, the greater the oxygen content within the closed environment at the same temperature, the faster the blackening of the first side of the plurality of electroformed elements occurs. Optional steps of rinsing in deionized water may occur.

Optionally, after step 1702, the method may continue to step 1704. In step 1704, the metallic article formed on the mandrel may be separated from the mandrel and attached to the photovoltaic cell before the blackening. Then, the blackening is performed in step 1706 as described.

Figure 18:
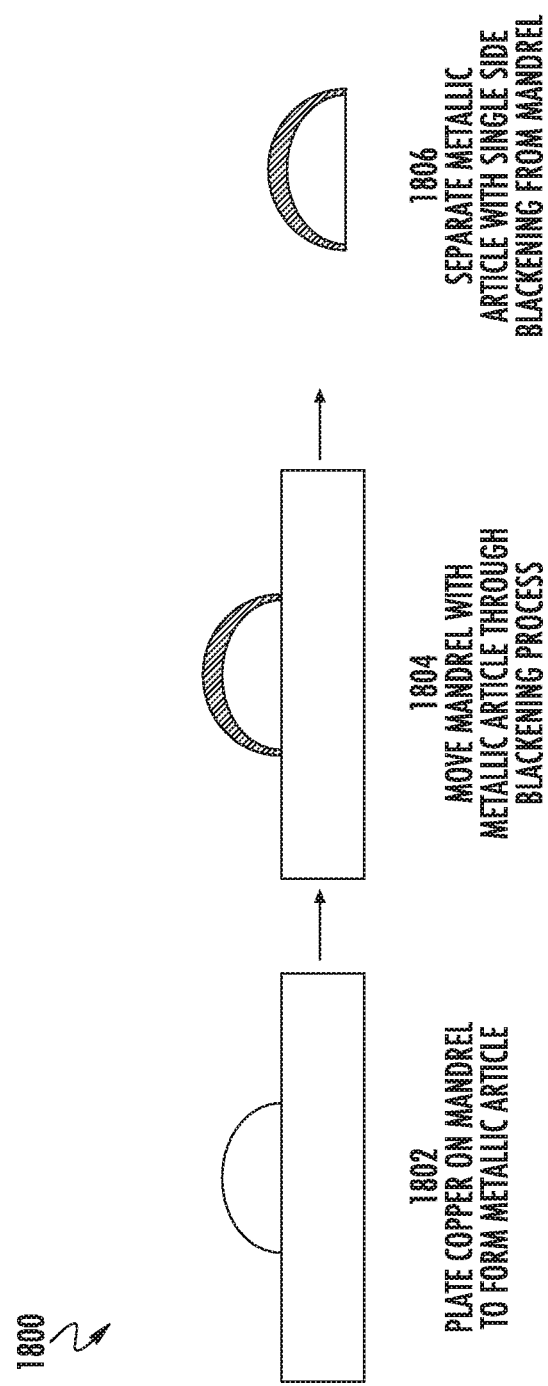
FIG. 18 depicts a schematic representation of the method for blackening a metallic article for a photovoltaic cell, in accordance with some embodiments.

The steps of method 1200 may be performed in other orders or some steps may be omitted. For example, in some embodiments, after the metallic article is electroformed, the soldering step 1206 may be omitted and the submerging method 1230, the spraying method 1400 or the exposure method 1700 may be performed while the metallic article is in the mandrel to blacken the first side of the plurality of electroformed elements. Then, the metallic article is separated from the mandrel and the blackening is present on only one side of the metallic article as shown in the schematic representation of FIG. 18. FIG. 18 depicts a schematic representation of the method for blackening a metallic article for a photovoltaic cell 1800, in accordance with some embodiments. The solder step may then be performed as disclosed herein on the opposite side of the metallic article or a solder paste or adhesive method may be used to attached the metallic article to the photovoltaic cell. In step 1802, copper is plated on the mandrel to form the metallic article. At step 1804, the metallic article remains on the mandrel so that the mandrel with the metallic article is moved through the blackening process such as by the submerging method 1230, the spraying method 1400 or the exposure method 1700. At step 1806, the metallic article is separated from the mandrel and the single side of the metallic article is blackened.

Figure 19:
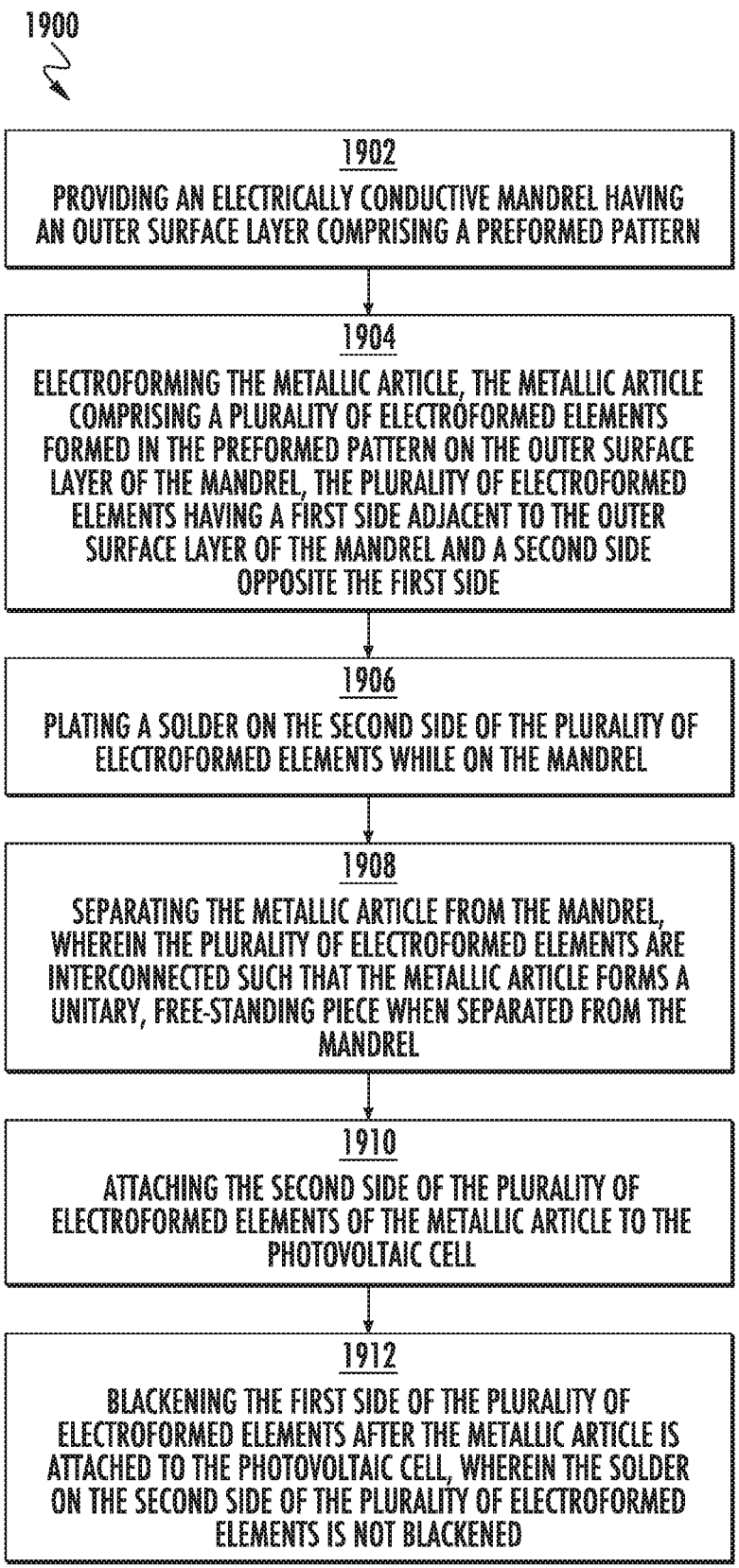
FIG. 19 is a simplified flowchart for a method of manufacturing a metallic article for a photovoltaic cell, in accordance with some embodiments.

In another example, in some embodiments, the metallic article formed on the mandrel may be separated from the mandrel and attached to the photovoltaic cell before the blackening. FIG. 19 is a simplified flowchart for a method of manufacturing a metallic article 1900 for a photovoltaic cell, in accordance with some embodiments. At step 1902, an electrically conductive mandrel having an outer surface layer comprising a preformed pattern is provided. At step 1904, the metallic article is electroformed. The metallic article includes a plurality of electroformed elements formed in the preformed pattern on the outer surface layer of the mandrel. The plurality of electroformed elements have a first side adjacent to the outer surface layer of the mandrel and a second side opposite the first side. At step 1906, a solder is plated on the second side of the plurality of electroformed elements while on the mandrel. In some embodiments, the second side includes an overplated portion formed on the second side of the plurality of electroformed elements, and the solder is plated on the overplated portion on the second side, as disclosed herein.

At step 1908, the metallic article is separated from the mandrel. The plurality of the electroformed elements are interconnected such that the metallic article forms a unitary, free-standing piece when separated from the mandrel. At step 1910, the second side of the plurality of electroformed elements of the metallic article is attached to the photovoltaic cell. At step 1912, the first side of the plurality of electroformed elements is blackened with the metallic article attached to the photovoltaic cell. The solder on the second side of the plurality of electroformed elements and the photovoltaic cell itself (i.e., semiconductor substrate to which the metallic article is attached) are not blackened. As disclosed herein, the submerging method 1230, the spraying method 1400 or the exposure method 1700 may be used as the blackening method. However, the spraying method 1600 to cause a layer of blackening while the metallic article is attached to the photovoltaic cell would require measures to prevent the paint from being applied to the photovoltaic cell and thus blocking light from impinging on the photovoltaic cell. This method 1900 allows selectively blackening the metallic article such as only the exposed copper side. Since the photovoltaic cell with the attached metallic article also undergoes the blackening process, any exposed copper on the photovoltaic cell may be blackened.

Figure 20:
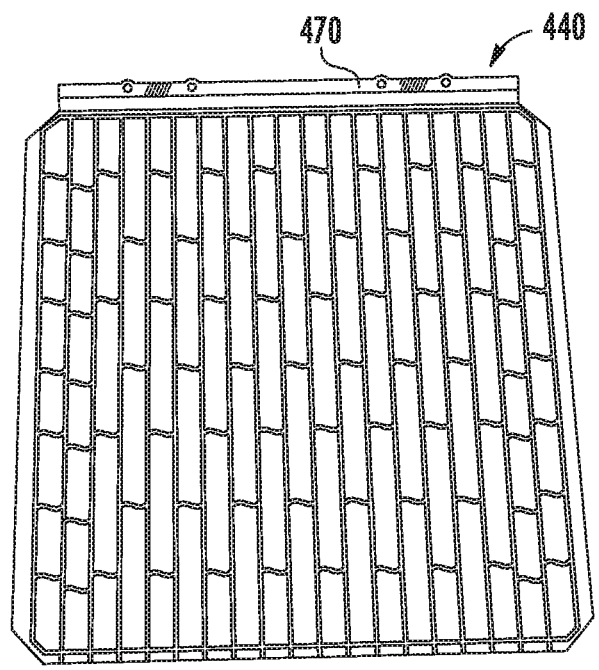
FIG. 20 shows a top view of photovoltaic cell with an unblackened metallic article, in accordance with some embodiments.
Figure 21:
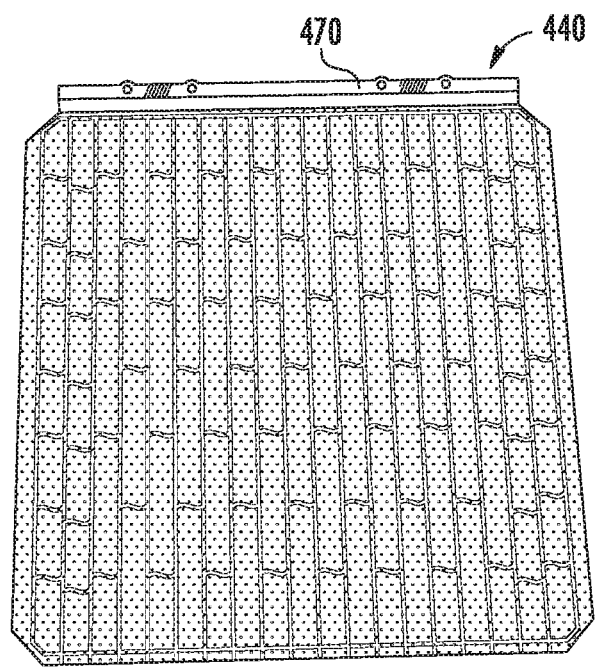
FIG. 21 is a top view of a photovoltaic cell with a blackened metallic article, in accordance with some embodiments.

FIG. 20 shows a top view of an unblackened metallic article mounted on a photovoltaic cell, in accordance with some embodiments. The first side of the plurality of electroformed elements of copper is the light-facing side as seen in the top view. FIG. 21 is a top view of a blackened metallic article on the solar cell with the blackened, first side showing. As can be seen, the blackened metallic article in FIG. 21 is much less visible than the unblackened metallic article in FIG. 20. Note that the metallic strip 470 of the cell-to-cell interconnect 440 has not been blackened in either FIG. 20 or FIG. 21. This further demonstrates the contrast between blackened and unblackened areas of the metallic article. In some embodiments, the metallic strip 470 of the cell-to-cell interconnect 440 is not blackened so it may be coupled to a back side of the neighboring photovoltaic cell such as by solder. Any of the blackening methods described herein (submerging method 1230, the spraying method 1400, the spraying method 1600 to cause a layer of blackening, or the exposure method 1700) may be used to achieve the blackening. Once dry, the second side of the metallic article, that is, the side of the plurality of electroformed elements with the solder, may be attached to the photovoltaic cell so that the solder side is adjacent to the photovoltaic cell and therefore on the underside and unseen.

The first side of the plurality of the electroformed elements with the blackening is the light-facing side and visible. Ideally, after the method for blackening, the first side of the plurality of electroformed elements with the blackening is a similar color to the photovoltaic cell. The blackening may be various colors such as gray, blue, brown, black or the like in order to match the color of the photovoltaic cell. When the photovoltaic cell and the metallic article are a similar color, the metallic article is greatly reduced in visibility or is not visible and the metallic article blends into the photovoltaic cell.

Figure 22C:
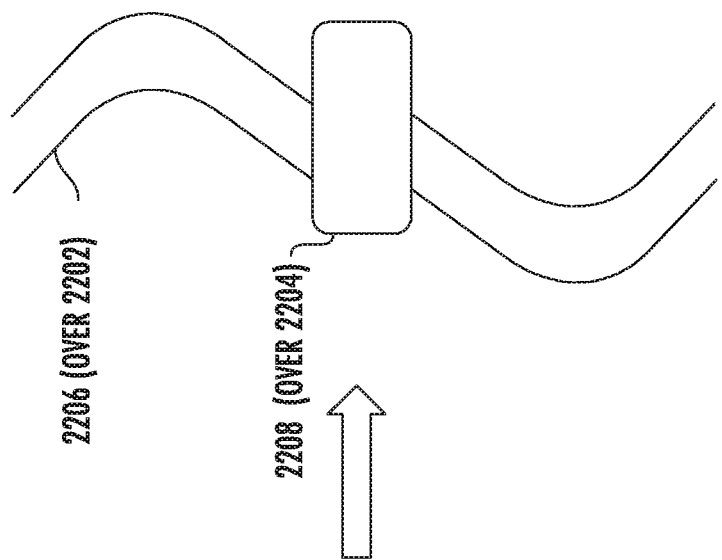
FIGS. 22A, 22B and 22C depict an illustration of the implementing the methods for blackening, in accordance with some embodiments.
Figure 22B:
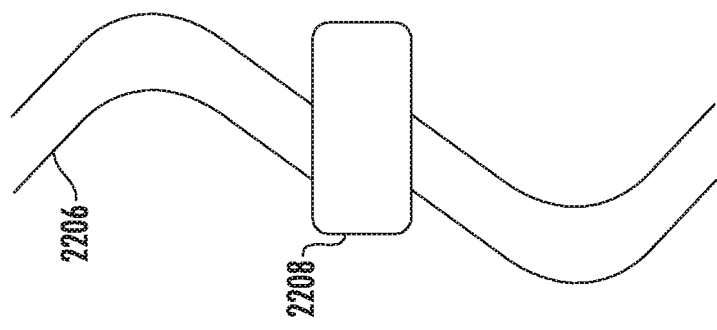
Figure 22A:
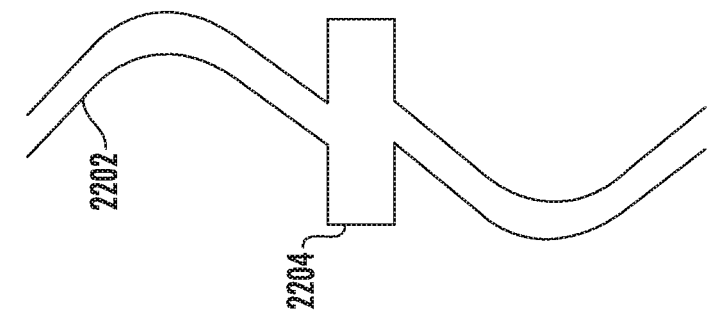

FIGS. 22A, 22B and 22C depict a close-up view of a blackened metallic article assembled onto a photovoltaic cell, in accordance with some embodiments. FIG. 22A is an example of a metallization layer (e.g., screen-printed silver fingers) 2202 of the photovoltaic cell, which in this embodiment has a curved geometry and includes a silver pad 2204 that serves as a bonding area for the metallic article. FIG. 22B is an example of a segment of the metallic article with blackening 2206, where the segment will be placed onto the segment 2202 and has solder pad 2208 that will be bonded to the silver pad 2204. The segment 2206 and solder pad 2208 of the metallic article are larger than the metallization 2202 and silver pad 2204 of the solar cell. When the metallic article is attached to the photovoltaic cell, the cell's metallization 2202 as shown in FIG. 22A is covered by the segment of the metallic article 2206 as shown in FIG. 22B, thereby forming FIG. 22C. The metallization layer 2202 of the solar cell is completely covered by the segment 2206 of the metallic article with the blackening. This demonstrates that complex grid designs including curved electroformed elements can be disguised or camouflaged with this process.

Figure 23A:
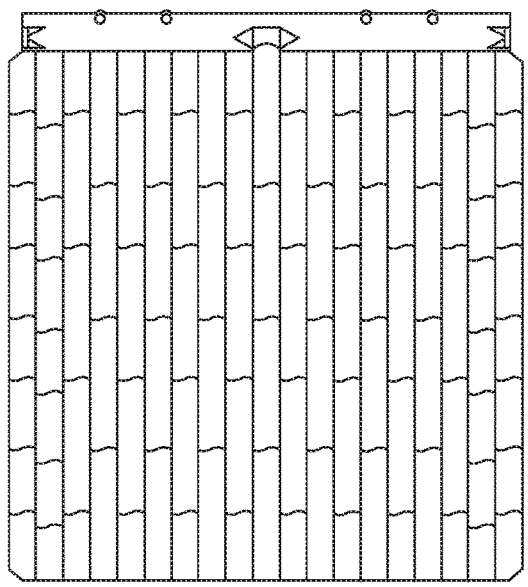
FIGS. 23A, 23B and 23C depict designs of the metallic article with curved paths of the electroformed elements, in accordance with some embodiments.
Figure 23B:
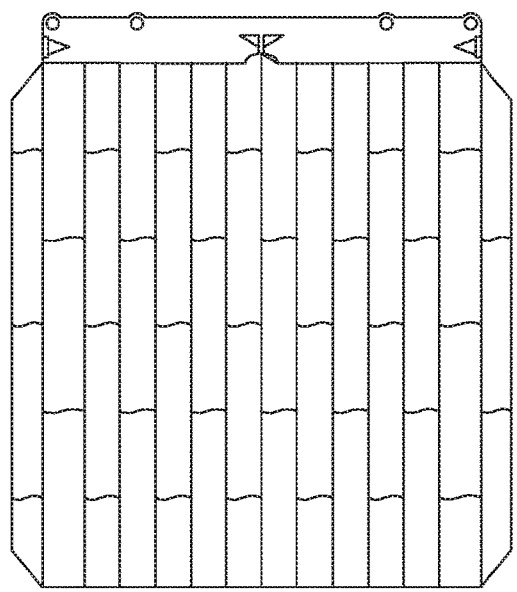
Figure 23C:
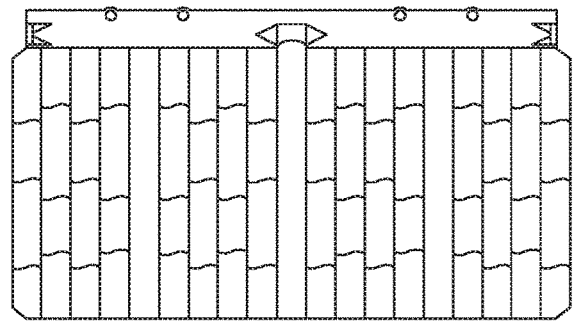

The metallic article comprised of the plurality of electroformed elements are formed in the preformed pattern on the outer surface layer of the mandrel. In some embodiments, the preformed pattern of the mandrel has curved paths along the length of the preformed pattern forming the plurality of electroformed elements with curved paths of the metallic article. This allows complex designs and curved paths along the length of the pattern of electroformed elements such as a wave-type pattern configured as, for example, a sine-wave or other curved shape or geometries. FIGS. 23A, 23B and 23C depict designs of the metallic article 2300a, 2300b and 2300c, each having curved paths of the electroformed elements, in accordance with some embodiments. The designs may be various sizes such as a six-inch grid, five-inch grid or a three-inch grid according to the size of the solar cell being used.

Figure 24A:
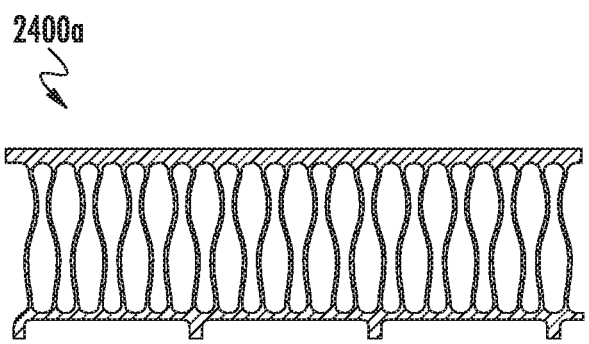
FIGS. 24A, 24B and 24C depict designs of the cell-to-cell interconnect comprised of curved surfaces, in accordance with some embodiments.
Figure 24B:
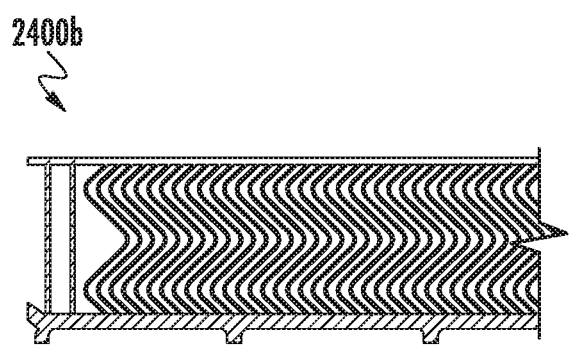
Figure 24C:
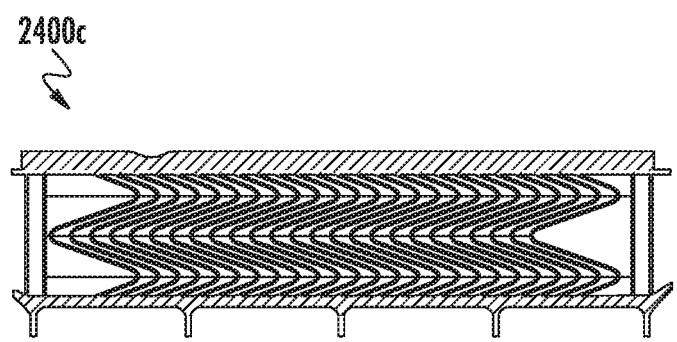

The cell-to-cell interconnect which are also electroformed elements formed integrally with the metallic article in the mandrel, may include curved appendages. In some embodiments, the plurality of electroformed elements have a cellto-cell interconnect, and the cell-to-cell interconnect has a plurality of curved appendages. Each appendage may have a first end coupled to an edge of the first region, and a second end opposite the first end and away from the edge. The appendages may be spaced apart from each other. In some embodiments, the pattern of appendages forms an outline of an hourglass or bowling pin shape comprised of curved surfaces within the original plane of the cell-to-cell interconnect, with little to no sharp or straight edges or angles. Other shapes may be used which may be asymmetric, long and sinusoidal wave-like shapes. FIGS. 24A, 24B and 24C depict designs of the cell-to-cell interconnect 2400a, 2400b and 2400c respectively comprised of curved surfaces, in accordance with some embodiments. The designs of the curved appendages may have varying amplitudes of the pattern and varying densities of the number of appendages per length.

Although these complex designs of the plurality of electroformed elements have many curved shapes, the various methods for blackening a metallic article for a photovoltaic cell disclosed herein may be used. Conventionally, single-sided blackening of electroformed elements has only been achieved on a straight copper ribbon which is very limited and does not allow for the customization of designs. By forming the plurality of electroformed elements on the mandrel with the prepattern design, a variety of shapes including many complex, curved surfaces and sizes may be blackened on the first side of the electroformed element.

The solder serves to mask the material of the second side of the metallic article so that the chemical reaction between the solution for the blackening and the solder on the second side of the electroformed elements cannot occur. Thus, the solder will not blacken but the opposite side, where the copper material of the electroformed element is exposed, will blacken by the chemical reaction. The masking ability of the solder is unique to using the mandrel in the present methods. Otherwise, it would be impossible to apply solder or the blackening to only a single side of a copper metallic article because both sides of the metallic article would be exposed to whichever process is being used. For example, if the metallic article was dipped into the solution for blackening, the chemical reaction would occur on both sides because the copper is exposed on both sides. Likewise, dipping the present metallic articles into solder, as is typically done in industry with conventional ribbons, would create a solder layer on both sides of the metallic article and the blackening process would not occur because the copper is not exposed.

The methods for blackening allow the electroformed elements such as the electrical contacts and interconnections of the light-facing side of the photovoltaic cell, to be blackened having a dark look which is a similar or the same color as the photovoltaic cell. This eliminates the shiny, light-reflective, and high contrast in color between the electroformed elements and the photovoltaic cell when attached together. This enables the photovoltaic cell to have desirable aesthetics of an attractive, sleek, uniform and professional look when used in various applications. The photovoltaic cell can now be integrated into designs and not be recognizable as a photovoltaic cell such as when used in shingles for solar roof panels. It also enables added and improved functionality because the photovoltaic cell can be used in disguised ways such as in military applications. The photovoltaic cell may now be camouflaged and stealth for undetectability. Moreover, because the electroformed elements are blackened and the cover glass or plastic sheet of the photovoltaic cell is unaltered, there is no decrease in performance of the photovoltaic cell.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method of manufacturing a metallic article for a photovoltaic cell, the method comprising:
   providing an electrically conductive mandrel having an outer surface layer comprising a preformed pattern;
   electroforming the metallic article, the metallic article comprising a plurality of electroformed elements formed in the preformed pattern on the outer surface layer of the mandrel, the plurality of electroformed elements having a first side adjacent to the outer surface layer of the mandrel and a second side opposite the first side;
   plating a solder on the second side of the plurality of electroformed elements while on the mandrel;
   separating the metallic article from the mandrel, wherein the plurality of electroformed elements are interconnected such that the metallic article forms a unitary, free-standing piece when separated from the mandrel; and
   blackening the first side of the plurality of electroformed elements after separating the metallic article from the mandrel, wherein the blackening comprises:
      dipping the metallic article in a solution comprised of nickel ions, reducing agents, complexing agents, neutralizers, a stabilizer, and a brightener to cause a chemical reaction resulting in the blackening of the first side of the plurality of electroformed elements; and
      exposing the metallic article to heat at 80 to 120 degrees Celsius; and
   wherein the solder on the second side of the plurality of electroformed elements is not blackened.

2. The method of claim 1, wherein the blackening further comprises rinsing the metallic article with sodium bicarbonate.

3. The method of claim 1, wherein the dipping of the metallic article includes dipping a portion of the metallic article or the entire metallic article.

4. The method of claim 1, wherein the metallic article is dipped in the solution for 45 to 140 seconds.

5. The method of claim 1, further comprising attaching the second side of the plurality of electroformed elements of the metallic article to the photovoltaic cell.

6. The method of claim 1, wherein the second side comprises an overplated portion formed on the second side of the plurality of electroformed elements, and the solder is plated on the overplated portion on the second side.

7. A method of, manufacturing a metallic article for a photovoltaic cell, the method comprising:
   providing an electrically conductive mandrel having an outer surface layer comprising a preformed pattern;
   electroforming the metallic article, the metallic article comprising a plurality of electroformed elements formed in the preformed pattern on the outer surface layer of the mandrel, the plurality of electroformed elements having a first side adjacent to the outer surface layer of the mandrel and a second side opposite the first side;

plating a solder on the second side of the plurality of electroformed elements while on the mandrel;

separating the metallic article from the mandrel, wherein the plurality of electroformed elements are interconnected such that the metallic article forms a unitary, free-standing piece when separated from the mandrel; and blackening the first side of the plurality of electroformed elements after separating the metallic article from the mandrel, wherein the blackening comprises:
  dipping the metallic article in a solution comprised of water and a potassium sulfide family to cause a chemical reaction resulting in the blackening of the first side of the plurality of electroformed elements; and
  exposing the metallic article to heat at 80 to 120 degrees Celsius; and
wherein the solder on the second side of the plurality of electroformed elements is not blackened.

8. The method of claim 7, wherein the dipping of the metallic article includes dipping a portion of the metallic article or the entire metallic article.

9. The method of claim 7, wherein the metallic article is dipped in the solution for 45 to 140 seconds.

10. The method of claim 7, further comprising attaching the second side of the plurality of electroformed elements of the metallic article to the photovoltaic cell.

11. A method of manufacturing a metallic article for a photovoltaic cell, the method comprising:
  providing an electrically conductive mandrel having an outer surface layer comprising a preformed pattern;
  electroforming the metallic article, the metallic article comprising a plurality of electroformed elements formed in the preformed pattern on the outer surface layer of the mandrel, the plurality of electroformed elements having a first side adjacent to the outer surface layer of the mandrel and a second side opposite the first side;
  plating a solder on the second side of the plurality of electroformed elements while on the mandrel;
  separating the metallic article from the mandrel, wherein the plurality of electroformed elements are interconnected such that the metallic article forms a unitary, free-standing piece when separated from the mandrel;
  attaching the second side of the plurality of electroformed elements of the metallic article to the photovoltaic cell; and
  blackening the first side of the plurality of electroformed elements after the metallic article is attached to the photovoltaic cell, wherein the blackening comprises:
    dipping the metallic article in a solution comprised of nickel ions, reducing agents, complexing agents, neutralizers, a stabilizer, and a brightener to cause a chemical reaction resulting in the blackening of the first side of the plurality of electroformed elements; and
    exposing the metallic article to heat at 80 to 120 degrees Celsius; and
  wherein the solder on the second side of the plurality of electroformed elements is not blackened.

12. The method of claim 11, wherein the blackening further comprises rinsing the metallic article with sodium bicarbonate.

13. The method of claim 11, wherein the dipping of the metallic article includes dipping a portion of the metallic article or the entire metallic article.

14. The method of claim 11, wherein the metallic article is dipped in the solution for 45 to 140 seconds.

15. A method of manufacturing a metallic article for a photovoltaic cell, the method comprising:
  providing an electrically conductive mandrel having an outer surface layer comprising a preformed pattern;
  electroforming the metallic article, the metallic article comprising a plurality of electroformed elements formed in the preformed pattern on the outer surface layer of the mandrel, the plurality of electroformed elements having a first side adjacent to the outer surface layer of the mandrel and a second side opposite the first side;
  plating a solder on the second side of the plurality of electroformed elements while on the mandrel;
  separating the metallic article from the mandrel, wherein the plurality of electroformed elements are interconnected such that the metallic article forms a unitary, free-standing piece when separated from the mandrel; and
  attaching the second side of the plurality of electroformed elements of the metallic article to the photovoltaic cell; and
  blackening the first side of the plurality of electroformed elements after the metallic article is attached to the photovoltaic cell, wherein the blackening comprises:
    dipping the metallic article in a solution comprised of water and a potassium sulfide family to cause a chemical reaction resulting in the blackening of the first side of the plurality of electroformed elements; and
    exposing the metallic article to heat at 80 to 120 degrees Celsius; and
  wherein the solder on the second side of the plurality of electroformed elements is not blackened.

16. The method of claim 15, wherein the dipping of the metallic article includes dipping a portion of the metallic article or the entire metallic article.

17. The method of claim 15, wherein the metallic article is dipped in the solution for 45 to 140 seconds.

* * * * *